United States Patent
Tao et al.

(10) Patent No.: US 9,581,653 B2
(45) Date of Patent: Feb. 28, 2017

(54) POST-DETERIORATION PERFORMANCE ESTIMATING APPARATUS AND POST-DETERIORATION PERFORMANCE ESTIMATING METHOD FOR ENERGY STORAGE DEVICE, AND ENERGY STORAGE SYSTEM

(71) Applicant: GS Yuasa International Ltd., Kyoto-Shi, Kyoto (JP)

(72) Inventors: Yohei Tao, Kyoto (JP); Shigeki Yamate, Kyoto (JP)

(73) Assignee: GS YUASA INTERNATIONAL LTD., Kyoto (JP)

(*) Notice: Subject to any disclaimer, the term of this patent is extended or adjusted under 35 U.S.C. 154(b) by 0 days.

(21) Appl. No.: 14/648,650

(22) PCT Filed: Nov. 27, 2013

(86) PCT No.: PCT/JP2013/006986
§ 371 (c)(1),
(2) Date: May 29, 2015

(87) PCT Pub. No.: WO2014/083853
PCT Pub. Date: Jun. 5, 2014

(65) Prior Publication Data
US 2015/0301118 A1    Oct. 22, 2015

(30) Foreign Application Priority Data

Nov. 30, 2012  (JP) ................................. 2012-263484
Sep. 11, 2013  (JP) ................................. 2013-188779

(51) Int. Cl.
G01R 31/36    (2006.01)
H01M 10/48   (2006.01)
H02J 7/00      (2006.01)

(52) U.S. Cl.
CPC ..... *G01R 31/3648* (2013.01); *G01R 31/3627* (2013.01); *G01R 31/3679* (2013.01);
(Continued)

(58) Field of Classification Search
USPC .......................................................... 702/63
See application file for complete search history.

(56) References Cited

U.S. PATENT DOCUMENTS 4,952,862 A * 8/1990 Biagetti ............... G01R 31/362
                                                          320/132
5,321,627 A * 6/1994 Reher ................ G01R 31/3624
                                                        320/DIG. 21
(Continued)

FOREIGN PATENT DOCUMENTS

EP    2475028 A1    7/2012
JP    S63-168582 A  7/1988
(Continued)

OTHER PUBLICATIONS

Extended Search Report issued in European Application No. 15160708.2, dated Sep. 25, 2015.
(Continued)

*Primary Examiner* — Paul D Lee
(74) *Attorney, Agent, or Firm* — Michael Best & Friedrich LLP

(57) ABSTRACT

A post-deterioration performance estimating apparatus estimates a post-deterioration performance value indicating performance of an energy storage device at a predetermined deterioration point, wherein discharge capacity of the energy storage device discharging at a predetermined first current is referred to as energy storage capacity, discharge capacity of the energy storage device discharging at a second current of a current value smaller than that of the first current is referred to as small current discharge capacity, a relational expression on relation among initial capacity of the energy storage device, a first capacity decreased amount obtained by subtracting the small current discharge capacity from the initial capacity, a second capacity decreased amount obtained by subtracting the energy storage capacity from the
(Continued)

small current discharge capacity, and a cumulative operating period as a cumulative value of operating periods of the energy storage device is referred to as a first relational expression, and the post-deterioration performance estimating apparatus includes a post-deterioration performance estimator configured to estimate the post-deterioration performance value at the deterioration point in accordance with the first relational expression and the cumulative operating period at the deterioration point.

18 Claims, 24 Drawing Sheets

(52) U.S. Cl.
CPC ......... *H01M 10/48* (2013.01); *G01R 31/3651* (2013.01); *G01R 31/3662* (2013.01); *H02J 7/0047* (2013.01); *H02J 2007/005* (2013.01)

(56) References Cited

U.S. PATENT DOCUMENTS

| | | | | |
|---|---|---|---|---|
| 5,847,566 | A * | 12/1998 | Marritt | G01R 31/362 324/427 |
| 5,994,877 | A | 11/1999 | Seri et al. | |
| 6,586,940 | B2 * | 7/2003 | Asakura | H02M 3/07 324/426 |
| 8,886,478 | B2 | 11/2014 | Fink | |
| 2007/0096743 | A1 * | 5/2007 | Arai | G01R 31/3679 324/426 |
| 2010/0073005 | A1 | 3/2010 | Yano | |
| 2011/0174556 | A1 | 7/2011 | Hermann | |
| 2012/0293114 | A1 * | 11/2012 | Murochi | H01M 10/06 320/107 |

FOREIGN PATENT DOCUMENTS

| | | |
|---|---|---|
| JP | H06-342045 A | 12/1994 |
| JP | H11-014717 A | 1/1999 |
| JP | 2000-228227 A | 8/2000 |
| JP | 2002-343444 A | 11/2002 |
| JP | 2008-117582 A | 5/2008 |
| JP | 2010-272365 A | 12/2010 |
| JP | 2012-524247 A | 10/2012 |

OTHER PUBLICATIONS

International Search Report issued in Application No. PCT/JP2013/006986, mailed Mar. 4, 2014.

* cited by examiner

| Cumulative operating period | Equilibrial capacity | Resistance value | Capacity ratio |
|---|---|---|---|
| $t_1$ | $Q_e1$ | R1 | $r_g1$ |
| $t_2$ | $Q_e2$ | R2 | $r_g2$ |
| $t_3$ | $Q_e3$ | R3 | $r_g3$ |
| ⋮ | ⋮ | ⋮ | ⋮ |

| | Prediction expression for post-deterioration | Discharge capacity (mAh) |
|---|---|---|
| Example | $Q = (1-r_q) \times (Q_0-Q_t)$<br>$= (1-a \times R-b) \times (Q_0-Q_t)$<br>$= (1-a \times \exp(A \times t+B)-b) \times (Q_0-Q_t)$<br>$= (1-0.0011 \times \exp(0.0012 \times t+4.96)+0.115) \times (Q_0-Q_t)$ | 349.2 (+45.9) |
| Comparative example 1 (Linear law) | $Q = -0.327 \times t + 628.1$ | 366.5 (+63.2) |
| Comparative example 2 (Root law) | $Q = -6.71 \times t^{0.5} + 641.3$ | 451.5 (+148.2) |
| Actually measured range | | 303.3 |

Alternating current resistance (1 kHz) [mOhm]

Direct current resistance (30th second) [mOhm]

POST-DETERIORATION PERFORMANCE ESTIMATING APPARATUS AND POST-DETERIORATION PERFORMANCE ESTIMATING METHOD FOR ENERGY STORAGE DEVICE, AND ENERGY STORAGE SYSTEM

TECHNICAL FIELD

The present invention relates to a post-deterioration performance estimating apparatus configured to estimate a post-deterioration performance value indicating performance of an energy storage device at a predetermined deterioration point, a post-deterioration performance estimating method, and an energy storage system including the energy storage device and the post-deterioration performance estimating apparatus.

BACKGROUND ART

An energy storage device like a lithium-ion secondary battery had been used as a power source of mobile equipment such as a notebook computer or a mobile phone. The energy storage device has been recently applied to wider fields and has been used as a power source of an electric vehicle. Such an energy storage device requires a technique for accurate estimation of discharge capacity (battery capacity) in a certain deterioration state.

There have been conventionally proposed techniques for estimation of discharge capacity of an energy storage device (see Patent Document 1 and Non-Patent Document 1, for example). Patent Document 1 discloses estimation of battery capacity according to the law (linear law) that a battery capacity retention ratio decreases in proportion to a battery cumulative operating period. Non-Patent Document 1 discloses estimation of battery capacity according to the law (root law) that a battery capacity retention ratio decreases slowly as a cumulative operating period elapses.

PRIOR ART DOCUMENTS

Patent Document

Patent Document 1: JP-A-2000-228227

Non-Patent Document

Non-Patent Document 1: H. Yoshida et al., Electrochemistry 78 (2010), 482

SUMMARY OF THE INVENTION

Problem to be Solved by the Invention

The conventional techniques fail to achieve accurate estimation of a post-deterioration performance value indicating performance such as discharge capacity of an energy storage device at a predetermined deterioration point of the energy storage device.

The present invention has been made to solve the problem mentioned above, and an object thereof is to provide a post-deterioration performance estimating apparatus, a post-deterioration performance estimating method, and an energy storage system, which achieve accurate estimation of a post-deterioration performance value indicating performance of an energy storage device at a predetermined deterioration point.

Means for Solving the Problem

In order to achieve the object mentioned above, a post-deterioration performance estimating apparatus according to an aspect of the present invention is configured to estimate a post-deterioration performance value indicating performance of an energy storage device at a predetermined deterioration point, wherein discharge capacity of the energy storage device discharging at a predetermined first current is referred to as energy storage capacity, discharge capacity of the energy storage device discharging at a second current of a current value smaller than that of the first current is referred to as small current discharge capacity, a relational expression on relation among initial capacity of the energy storage device, a first capacity decreased amount obtained by subtracting the small current discharge capacity from the initial capacity, a second capacity decreased amount obtained by subtracting the energy storage capacity from the small current discharge capacity, and a cumulative operating period as a cumulative value of operating periods of the energy storage device is referred to as a first relational expression, and the post-deterioration performance estimating apparatus includes a post-deterioration performance estimator configured to estimate the post-deterioration performance value at the deterioration point in accordance with the first relational expression and the cumulative operating period at the deterioration point.

The present invention can be embodied as such a post-deterioration performance estimating apparatus, as well as an energy storage system including an energy storage device and a post-deterioration performance estimating apparatus configured to estimate a post-deterioration performance value of the energy storage device. The present invention can be also embodied as a post-deterioration performance estimating method including the steps of characteristic processes executed by the post-deterioration performance estimating apparatus. Furthermore, the present invention can be embodied as an integrated circuit equipped with characteristic processors included in the post-deterioration performance estimating apparatus. Moreover, the present invention can be embodied as a program configured to cause a computer to execute the characteristic processes included in the post-deterioration performance estimating method, or a recording medium such as a computer-readable compact disc-read only memory (CD-ROM) storing the program. Such a program can be obviously distributed by means of a recording medium such as a CD-ROM or through a transmission medium such as the Internet.

Advantage of the Invention

The present invention achieves accurate estimation of a post-deterioration performance value indicating performance of an energy storage device at a predetermined deterioration point.

BRIEF DESCRIPTION OF THE DRAWINGS

FIG. 13 is an explanatory chart on the effects exerted by the post-deterioration performance estimating apparatus according to the embodiment of the present invention.

Figure 1:
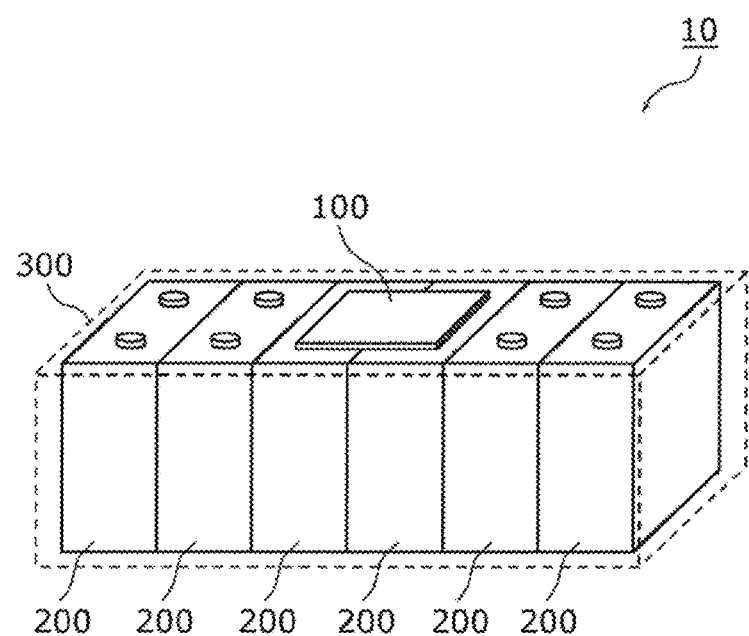
FIG. 1 is an external view of an energy storage system including a post-deterioration performance estimating apparatus according to an embodiment of the present invention.

MODES FOR CARRYING OUT THE INVENTION (Finding as Basis of the Invention)

The conventional techniques fail to achieve accurate estimation of a post-deterioration performance value of an energy storage device. A lithium-ion secondary battery used in a hybrid vehicle or an electric vehicle particularly has sudden decrease in discharge capacity at the end of its life. Accurate estimation of such sudden decrease in discharge capacity is difficult with the conventional discharge capacity estimating method according to the linear law or the root law. The conventional method fails to achieve accurate estimation of a post-deterioration performance value indicating performance such as discharge capacity of an energy storage device at a predetermined deterioration point.

The present invention has been made to solve the problem mentioned above, and an object thereof is to provide a post-deterioration performance estimating apparatus, a post-deterioration performance estimating method, and an energy storage system, which achieve accurate estimation of a post-deterioration performance value indicating performance of an energy storage device at a predetermined deterioration point.

In order to achieve the object mentioned above, a post-deterioration performance estimating apparatus according to an aspect of the present invention is configured to estimate a post-deterioration performance value indicating performance of an energy storage device at a predetermined deterioration point, wherein discharge capacity of the energy storage device discharging at a predetermined first current is referred to as energy storage capacity, discharge capacity of the energy storage device discharging at a second current of a current value smaller than that of the first current is referred to as small current discharge capacity, a relational expression on relation among initial capacity of the energy storage device, a first capacity decreased amount obtained by subtracting the small current discharge capacity from the initial capacity, a second capacity decreased amount obtained by subtracting the energy storage capacity from the small current discharge capacity, and a cumulative operating period as a cumulative value of operating periods of the energy storage device is referred to as a first relational expression, and the post-deterioration performance estimating apparatus includes a post-deterioration performance estimator configured to estimate the post-deterioration performance value at the deterioration point in accordance with the first relational expression and the cumulative operating period at the deterioration point.

According to the above aspect, the post-deterioration performance estimating apparatus estimates the post-deterioration performance value of the energy storage device at the predetermined deterioration point in accordance with the first relational expression on the relation among the initial capacity, the first capacity decreased amount, the second capacity decreased amount, and the cumulative operating period of the energy storage device, as well as the cumulative operating period at the deterioration point. The inventors of the present application have found, through intensive studies and tests, that the post-deterioration performance value such as discharge capacity at the deterioration point can be accurately estimated by separating the decreased amount in discharge capacity into the first capacity decreased amount and the second capacity decreased amount and applying the first relational expression on the relation among the first capacity decreased amount, the second capacity decreased amount, and the cumulative operating period of the energy storage device. The first current can be the constant current of 1 CA, and the second current can be a current of a current value most approximate to zero. The post-deterioration performance estimating apparatus can thus accurately estimate the post-deterioration performance value of the energy storage device at the predetermined deterioration point.

The post-deterioration performance estimator can estimate the post-deterioration performance value in accordance with the first relational expression including the initial capacity, the first capacity decreased amount, the second capacity decreased amount, and a member of an exponential function of the cumulative operating period.

The inventors of the present application have found, through intensive studies and tests, that the post-deterioration performance value can be accurately estimated by applying, as the first relational expression, the relational expression including the initial capacity, the first capacity decreased amount, the second capacity decreased amount, and the member of the exponential function of the cumulative operating period. The post-deterioration performance estimating apparatus can thus accurately estimate the post-deterioration performance value of the energy storage device at the predetermined deterioration point.

The post-deterioration performance estimator can estimate the post-deterioration performance value in accordance with the first relational expression including a second relational expression on relation among the initial capacity, the first capacity decreased amount, the second capacity decreased amount, and a resistance value of direct current resistance or alternating current resistance of the energy storage device and a third relational expression on relation between the resistance value and the cumulative operating period.

The inventors of the present application have found, through intensive studies and tests, that the post-deterioration performance value of the energy storage device can be accurately calculated from the resistance value of the energy storage device and the resistance value can be accurately calculated from the cumulative operating period of the energy storage device. The post-deterioration performance estimating apparatus can thus accurately calculate the resistance value of the energy storage device in accordance with the cumulative operating period and the third relational expression, and can accurately estimate the post-deterioration performance value of the energy storage device in accordance with the resistance value and the second relational expression. The post-deterioration performance estimating apparatus can thus accurately estimate the post-deterioration performance value of the energy storage device at the predetermined deterioration point.

The post-deterioration performance estimator can estimate the post-deterioration performance value in accordance with the second relational expression on relation between capacity ratio, as a ratio of the second capacity decreased amount to the small current discharge capacity, and the resistance value.

The inventors of the present application have found, through intensive studies and tests, that the post-deterioration performance value can be accurately estimated by applying the second relational expression on the relation between the capacity ratio and the resistance value. The post-deterioration performance estimating apparatus can thus accurately estimate the post-deterioration performance value of the energy storage device at the predetermined deterioration point.

The post-deterioration performance estimator can estimate the post-deterioration performance value in accordance with the second relational expression on the capacity ratio that is expressed by a linear function of the resistance value.

The inventors of the present application have found, through intensive studies and tests, that the post-deterioration performance value can be accurately estimated by applying the second relational expression on the capacity ratio that is expressed by the linear function of the resistance value. The post-deterioration performance estimating apparatus can thus accurately estimate the post-deterioration performance value of the energy storage device at the predetermined deterioration point.

The post-deterioration performance estimator can estimate the post-deterioration performance value in accordance with the second relational expression that has a coefficient varying depending on whether operating temperature of the energy storage device exceeds or is not more than predetermined temperature.

The inventors of the present application have found, through intensive studies and tests, that the coefficient in the second relational expression varies depending on whether or not the operating temperature of the energy storage device exceeds the predetermined temperature (e.g. 60° C.). The post-deterioration performance estimating apparatus can thus accurately estimate the post-deterioration performance value of the energy storage device at the predetermined deterioration point in accordance with the second relational expression having the coefficient that varies depending on the operating temperature of the energy storage device.

The post-deterioration performance estimator can include: a data acquiring unit configured to acquire the small current discharge capacity at the deterioration point; a capacity ratio calculator configured to calculate the capacity ratio at the deterioration point in accordance with the resistance value at the deterioration point and the second relational expression; and a post-deterioration performance calculator configured to calculate the post-deterioration performance value in accordance with a fourth relational expression on relation among the post-deterioration performance value, the acquired small current discharge capacity, and the calculated capacity ratio.

According to the above aspect, the post-deterioration performance estimating apparatus calculates the capacity ratio at the deterioration point in accordance with the resistance value at the deterioration point and the second relational expression, and calculates the post-deterioration performance value in accordance with the fourth relational expression on the relation among the post-deterioration performance value, the small current discharge capacity at the deterioration point, and the capacity ratio. The post-deterioration performance estimating apparatus can accurately estimate the post-deterioration performance value of the energy storage device at the predetermined deterioration point in accordance with the second and fourth relational expressions.

The post-deterioration performance calculator can calculate the post-deterioration performance value by multiplying a value obtained by subtracting the capacity ratio from one and the small current discharge capacity.

The inventors of the present application have found, through intensive studies and tests, that the post-deterioration performance value can be accurately calculated by multiplying the value obtained by subtracting the capacity ratio from one and the small current discharge capacity. The post-deterioration performance estimating apparatus can thus accurately estimate the post-deterioration performance value of the energy storage device at the predetermined deterioration point.

The post-deterioration performance estimator can estimate the post-deterioration performance value in accordance with the third relational expression on the resistance value at a time point after elapse of the cumulative operating period, the resistance value being in proportion to an exponential function that has a variable obtained by multiplying the cumulative operating period and a predetermined coefficient.

The resistance value of the energy storage device acceleratingly increases as the cumulative operating period elapses. The inventors of the present application have found, through intensive studies and tests, that the relational expression on the resistance value in proportion to the exponential function having the variable obtained by multiplying the cumulative operating period and the predetermined coefficient accurately expresses a temporal change of the resistance value. The post-deterioration performance estimating apparatus can thus correctly express the relation between the resistance value and the cumulative operating period by the third relational expression and can accurately estimate the post-deterioration performance value of the energy storage device at the predetermined deterioration point.

The post-deterioration performance estimator can estimate the post-deterioration performance value in accordance with the third relational expression having the predetermined coefficient that is an exponential function having a reciprocal of the operating temperature of the energy storage device as a variable.

The inventors of the present application have found, through intensive studies and tests, that the temporal change in resistance value of the energy storage device can be expressed accurately if the coefficient in the exponential function of the third relational expression is the exponential function having the reciprocal of the operating temperature of the energy storage device as the variable. The post-deterioration performance estimating apparatus can thus accurately estimate the post-deterioration performance value of the energy storage device at the predetermined deterioration point in accordance with the third relational expression corrected in terms of temperature.

The post-deterioration performance estimator can estimate the post-deterioration performance value in accordance with the third relational expression that has the coefficient in the exponential function having the reciprocal of the operating temperature of the energy storage device as the variable, the coefficient varying depending on whether the operating temperature of the energy storage device exceeds or is not more than predetermined temperature.

The inventors of the present application have found, through intensive studies and tests, that the coefficient in the exponential function having the reciprocal of the operating temperature of the energy storage device as the variable in the third relational expression varies depending on whether or not the operating temperature of the energy storage device exceeds the predetermined temperature (e.g. 60° C.). The post-deterioration performance estimating apparatus can thus accurately estimate the post-deterioration performance value of the energy storage device at the predetermined deterioration point in accordance with the third relational expression having the coefficient that varies depending on the operating temperature of the energy storage device.

The post-deterioration performance estimator can include: a data acquiring unit configured to acquire the cumulative operating period at the deterioration point; and a resistance value calculator configured to calculate the resistance value at the deterioration point in accordance with the acquired cumulative operating period and the third relational expression.

According to the above aspect, the post-deterioration performance estimating apparatus can calculate the resistance value at the deterioration point by acquiring the cumulative operating period at the deterioration point, and can thus accurately estimate the post-deterioration performance value of the energy storage device from the resistance value.

The post-deterioration performance estimator can estimate the post-deterioration performance value in accordance with the first relational expression obtained from the first capacity decreased amount that includes a member of a square root of the cumulative operating period and has, as a coefficient in the member of the square root, an exponential function having a reciprocal of the operating temperature of the energy storage device as a variable.

The inventors of the present application have found, through intensive studies and tests, that the first capacity decreased amount can be expressed accurately if the exponential function having the reciprocal of the operating temperature of the energy storage device as the variable is applied to the coefficient in the root member of the cumulative operating period as the first capacity decreased amount. The post-deterioration performance estimating apparatus can thus accurately estimate the post-deterioration performance value of the energy storage device at the predetermined deterioration point from the first capacity decreased amount corrected in terms of temperature.

The post-deterioration performance estimator further can include a relational expression corrector configured to correct the first relational expression, and can estimate the post-deterioration performance value in accordance with the corrected first relational expression.

According to the above aspect, the post-deterioration performance estimating apparatus corrects the first relational expression and estimates the post-deterioration performance value in accordance with the corrected first relational expression. The post-deterioration performance estimating apparatus can thus correctly estimate the post-deterioration performance value by correcting the first relational expression to improve accuracy of the first relational expression.

The energy storage device can be a lithium-ion secondary battery containing layered lithium transition metal oxide as a positive active material, and the post-deterioration performance estimator can estimate the post-deterioration performance value in accordance with the first relational expression for the lithium-ion secondary battery.

According to the above aspect, the energy storage device is a lithium-ion secondary battery including layered lithium transition metal oxide as the positive active material. The inventors of the present application have found, through intensive studies and tests, that the first relational expression can accurately express a deterioration state if the energy storage device is the lithium-ion secondary battery.

The post-deterioration performance estimating apparatus can thus correctly estimate post-deterioration performance value of the lithium-ion secondary battery.

A post-deterioration performance estimating apparatus for an energy storage device and an energy storage system including the post-deterioration performance estimating apparatus according to an embodiment of the present invention will now be described with reference to the drawings. The embodiment to be described below includes preferred specific examples of the present invention. Numerical values, shapes, materials, constituent elements, disposition and connection configurations of the constituent elements, the steps, the order of the steps, and the like to be mentioned in the following embodiment are merely exemplary and will not limit the scope of the present invention. Out of the constituent elements according to the following embodiment, those constituent elements not recited in the independent claims on the superordinate concept of the present invention are to be described as optional constituent elements according to more preferred modes.

(Embodiment)

A configuration of an energy storage system 10 will be described initially.

FIG. 1 is an external view of the energy storage system 10 including a post-deterioration performance estimating apparatus 100 according to the embodiment of the present invention.

As depicted in this figure, the energy storage system 10 includes the post-deterioration performance estimating apparatus 100, a plurality of (six in this figure) energy storage devices 200, and a case 300 accommodating the post-deterioration performance estimating apparatus 100 and the plurality of energy storage devices 200.

The post-deterioration performance estimating apparatus 100 is a circuit board that is disposed above the plurality of energy storage devices 200 and is equipped with a circuit configured to estimate discharge capacity of the plurality of energy storage devices 200. Specifically, the post-deterioration performance estimating apparatus 100 is connected to the plurality of energy storage devices 200, acquires information from the plurality of energy storage devices 200, and estimates a post-deterioration performance value indicating performance of the plurality of energy storage devices 200 at a predetermined deterioration point.

The post-deterioration performance value according to the present embodiment is assumed to be discharge capacity of the energy storage device 200 at the predetermined deterioration point. The post-deterioration performance value estimated by the post-deterioration performance estimating apparatus 100 will be hereinafter referred to as post-deterioration capacity. In other words, the post-deterioration performance estimating apparatus 100 estimates post-deterioration capacity as discharge capacity of the energy storage device 200 at the predetermined deterioration point.

While the post-deterioration performance estimating apparatus 100 is disposed above the plurality of energy storage devices 200, the post-deterioration performance estimating apparatus 100 can be disposed anywhere. A detailed functional configuration of the post-deterioration performance estimating apparatus 100 is to be described later.

The energy storage device 200 is a secondary battery such as a nonaqueous electrolyte secondary battery including a positive electrode and a negative electrode. In this figure, the six rectangular energy storage devices 200 are disposed in series as assembled batteries. The number of the energy storage devices 200 is not limited to six, but can be any other plural number or can be one. Furthermore, the energy storage devices 200 are not particularly limited in shape.

The energy storage device 200 has the positive electrode and the negative electrode. The positive electrode includes positive electrode substrate foil in a long belt shape made of aluminum, aluminum alloy, or the like, and a positive active material layer provided on the positive electrode substrate foil. The negative electrode includes negative electrode substrate foil in a long belt shape made of copper, copper alloy, or the like, and a negative active material layer provided on the negative electrode substrate foil. The positive active material in the positive active material layer or the negative active material in the negative active material layer can be made of any appropriate known material if the positive active material or the negative active material can occlude and emit lithium ions.

The energy storage device 200 is preferably a lithium-ion secondary battery including layered lithium transition metal oxide as the positive active material. Specifically, preferred examples of the positive active material include layered lithium transition metal oxide such as $Li_{1+x}M_{1-y}O_2$ (M is one or at least two transition metal elements selected from Fe, Ni, Mn, Co, and the like, and x and y satisfy $0 \leq x < 1/3$ and $0 \leq y < 1/3$) (e.g. $LiNi_{1/3}Co_{1/3}Mn_{1/3}O_2$). The positive active material can include spinel lithium-manganese oxide such as $LiMn_2O_4$ and $LiMn_{1.5}Ni_{0.5}O_4$ or an olivine positive active material such as $LiFePO_4$, which is mixed with the layered lithium transition metal oxide.

Examples of the negative active material include lithium metal, lithium alloy (lithium metal containing alloy such as lithium silicon, lithium aluminum, lithium lead, lithium tin, lithium aluminum tin, lithium gallium, and wood's alloy), lithium occludable and emittable alloy, a carbon material (e.g. graphite, hardly graphitizable carbon, easily graphitizable carbon, low-temperature baked carbon, and amorphous carbon), silicon oxide, metal oxide, lithium metal oxide (e.g. $Li_4Ti_5O_{12}$), a polyphosphoric acid compound, and a compound of transition metal and a group 14 or 16 element, such as $Co_3O_4$ or $Fe_2P$, which is typically called a conversion negative electrode.

The detailed functional configuration of the post-deterioration performance estimating apparatus 100 will be described next.

Figure 2:
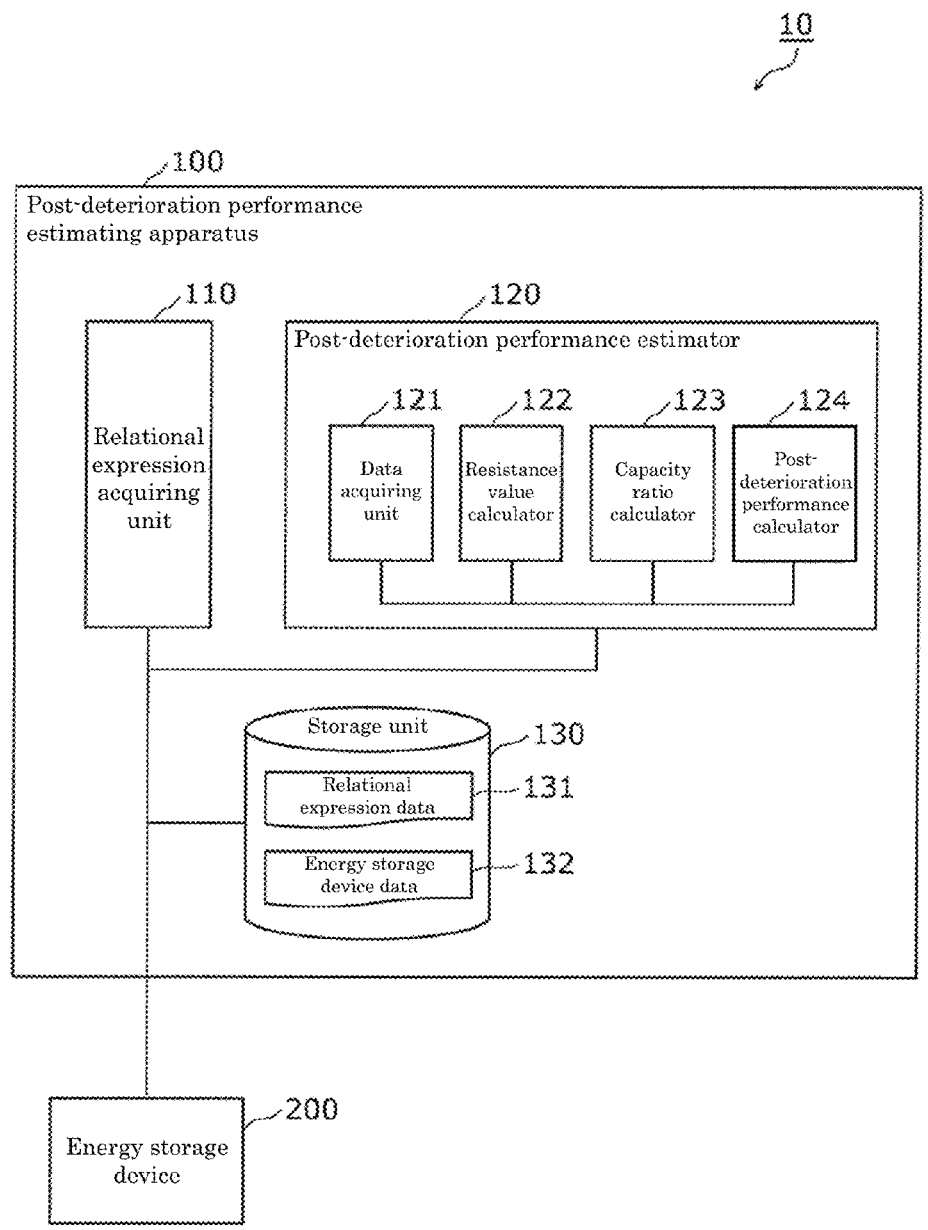
FIG. 2 is a block diagram depicting a functional configuration of the post-deterioration performance estimating apparatus according to the embodiment of the present invention.

FIG. 2 is a block diagram depicting the functional configuration of the post-deterioration performance estimating apparatus 100 according to the embodiment of the present invention.

The post-deterioration performance estimating apparatus 100 estimates post-deterioration capacity as discharge capacity of the energy storage device 200 at the predetermined deterioration point. The post-deterioration performance estimating apparatus 100 according to the present embodiment estimates post-deterioration capacity of the energy storage device 200 that is assumed to operate at substantially constant temperature not more than 60° C.

As depicted in this figure, the post-deterioration performance estimating apparatus 100 includes a relational expression acquiring unit 110, a post-deterioration performance estimator 120, and a storage unit 130. Relational expression data 131 and energy storage device data 132 are stored in the storage unit 130.

The relational expression acquiring unit 110 acquires a relational expression on a deterioration state of discharge capacity of the energy storage device 200. In other words, the relational expression acquiring unit 110 acquires a first relational expression on relation among initial capacity, an equilibrial capacity decreased amount, a kinetic capacity decreased amount, and a cumulative operating period of the energy storage device 200. Specifically, the relational expression acquiring unit 110 acquires the first relational expression including the initial capacity, the equilibrial capacity decreased amount, the kinetic capacity decreased amount, and a member of an exponential function of the cumulative operating period.

Assume that energy storage capacity indicates discharge capacity of the energy storage device 200 that is discharged at a predetermined first current and equilibrial capacity indicates discharge capacity of the energy storage device 200 that is discharged at a second current of a current value smaller than that of the first current. Furthermore, assume that the equilibrial capacity decreased amount has a value obtained by subtracting the equilibrial capacity from the initial capacity of the energy storage device 200, and the kinetic capacity decreased amount has a value obtained by subtracting the energy storage capacity from the equilibrial capacity.

The equilibrial capacity, the equilibrial capacity decreased amount, and the kinetic capacity decreased amount correspond to "small current discharge capacity", a "first capacity decreased amount", and a "second capacity decreased amount" recited in the claims, respectively.

The initial capacity of the energy storage device 200 corresponds to reversible capacity of the energy storage device 200 in an initial state discharged at the second current. The initial state of the energy storage device 200 is for example, the state at the time of production or delivery of the energy storage device 200. The initial capacity is not limited to the above definition, but can correspond to reversible capacity at a certain time point after the energy storage device 200 starts operation.

The cumulative operating period has a cumulative value of operating periods of the energy storage device 200, and specifically indicates a total period obtained by adding the operating periods of the energy storage device 200 from an operation start point of the energy storage device 200 to a predetermined time point. In a case where the energy storage device 200 operates intermittently, the cumulative operating period is obtained by subtracting non-operating periods during which the energy storage device 200 is not in operation. The non-operating periods may not be subtracted precisely, but the cumulative operating period can indicate the entire period from the operation start point of the energy storage device 200 to the predetermined time point, inclusive of the non-operating periods. The cumulative operating period is preferably indicated by a unit of time or cycle (cycle number), but can be indicated by any unit relating to period such as month or day.

More specifically, the relational expression acquiring unit 110 acquires a second relational expression on relation among the initial capacity, the equilibrial capacity decreased amount, the kinetic capacity decreased amount, and a resistance value of the energy storage device 200, and a third relational expression on relation between the resistance value and the cumulative operating period, to acquire the first relational expression including the second relational expression and the third relational expression.

The resistance value relates to direct current resistance or alternating current resistance of the energy storage device 200. In other words, the resistance value relates to internal resistance of the energy storage device 200. For example, the resistance value relates to 1 kHz alternating current resistance or direct current resistance at the tenth second.

The relational expression acquiring unit 110 acquires the second relational expression on relation between capacity ratio as a ratio of the kinetic capacity decreased amount to the equilibrial capacity and the resistance value. In other words, the relational expression acquiring unit 110 acquires the second relational expression on the capacity ratio expressed by a linear function of the resistance value. The relational expression acquiring unit 110 also acquires the third relational expression on the resistance value at a time point after elapse of the cumulative operating period, and the resistance value is in proportion to an exponential function having a variable obtained by multiplying the cumulative operating period and a predetermined coefficient.

The relational expression acquiring unit 110 acquires the first relational expression by reading out the first relational expression including the second relational expression and the third relational expression from the relational expression data 131 stored in the storage unit 130. The relational expression data 131 includes first relational expressions each including corresponding second and third relational expressions for estimation of post-deterioration capacity of the energy storage device 200. The first relational expression is to be described in detail later.

The post-deterioration performance estimator 120 estimates post-deterioration capacity as energy storage capacity at the predetermined deterioration point in accordance with the first relational expression acquired by the relational expression acquiring unit 110 and the cumulative operating period of the energy storage device 200 at the deterioration point. The post-deterioration performance estimator 120 includes a data acquiring unit 121, a resistance value calculator 122, a capacity ratio calculator 123, and a post-deterioration performance calculator 124.

The data acquiring unit 121 acquires the cumulative operating period and the equilibrial capacity of the energy storage device 200 at the deterioration point. The data acquiring unit 121 can measure to acquire the cumulative operating period, or can acquire the same from outside, which is inputted by a user, for example. The data acquiring unit 121 can acquire the equilibrial capacity by estimating the same in accordance with a known technique such as the root law. Details thereof are to be described later. The data acquiring unit 121 then stores the cumulative operating period and the equilibrial capacity of the energy storage device 200 thus acquired in the energy storage device data 132 in the storage unit 130.

The resistance value calculator 122 calculates the resistance value at the deterioration point in accordance with the cumulative operating period acquired by the data acquiring unit 121 and the third relational expression. Specifically, the resistance value calculator 122 reads out the cumulative operating period stored in the energy storage device data 132 in the storage unit 130 and the third relational expression stored in the relational expression data 131 to calculate the resistance value. The resistance value calculator 122 then stores the calculated resistance value in the energy storage device data 132 in the storage unit 130.

The capacity ratio calculator 123 calculates the capacity ratio at the deterioration point in accordance with the resistance value, at the deterioration point, calculated by the resistance value calculator 122 and the second relational expression. Specifically, the capacity ratio calculator 123 reads out the resistance value stored in the energy storage device data 132 in the storage unit 130 and the second relational expression stored in the relational expression data 131 to calculate the capacity ratio. The capacity ratio calculator 123 then stores the calculated capacity ratio in the energy storage device data 132 in the storage unit 130.

The post-deterioration performance calculator 124 calculates the post-deterioration capacity in accordance with a fourth relational expression on relation among the post-deterioration capacity, the equilibrial capacity acquired by the data acquiring unit 121, and the capacity ratio calculated by the capacity ratio calculator 123. Specifically, the post-deterioration performance calculator 124 calculates the post-deterioration capacity by multiplying a value obtained by subtracting the capacity ratio from one and the equilibrial capacity. In other words, the post-deterioration performance calculator 124 reads out the equilibrial capacity and the capacity ratio stored in the energy storage device data 132 in the storage unit 130 and calculates the post-deterioration capacity in accordance with the fourth relational expression.

Figures 3, 4:
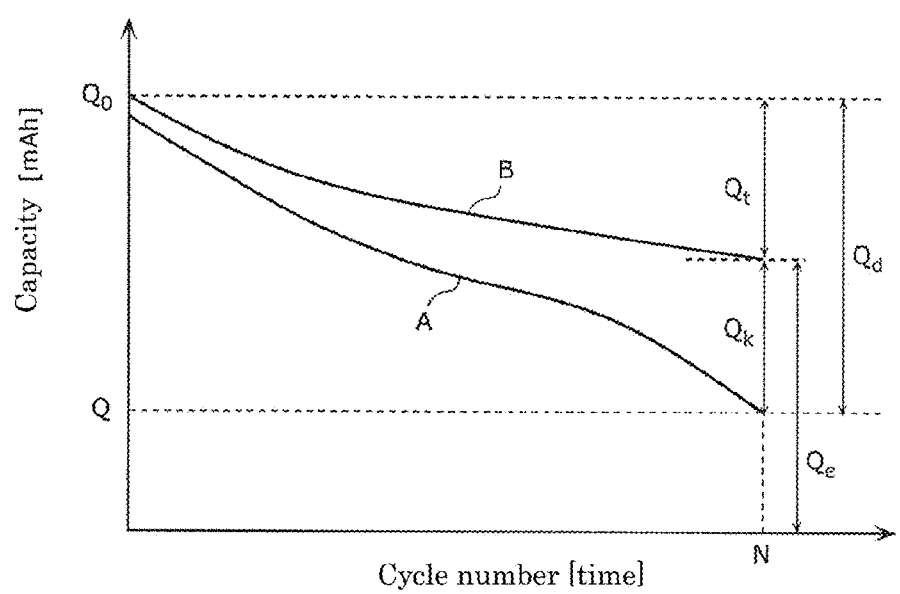
FIG. 3 is a chart exemplifying energy storage device data according to the embodiment of the present invention.
FIG. 4 is an explanatory graph on a first relational expression acquired by a relational expression acquiring unit according to the embodiment of the present invention.

FIG. 3 is a chart exemplifying the energy storage device data 132 according to the embodiment of the present invention.

The energy storage device data 132 contains sets of data on the cumulative operating period, the equilibrial capacity, the resistance value, and the capacity ratio of the energy storage device 200 at the predetermined deterioration point. As indicated in this figure, the energy storage device data 132 is a data chart of the "cumulative operating period", the "equilibrial capacity", the "resistance value", and the "capacity ratio" corresponding to one another.

The column in the "cumulative operating period" has values of cumulative operating periods of the energy storage device 200 at predetermined deterioration points, the column in the "equilibrial capacity" has values of equilibrial capacity of the energy storage device 200 at the deterioration points, the column in the "resistance value" has resistance values of the energy storage device 200 at the deterioration points, and the column in the "capacity ratio" has values of capacity ratios of the energy storage device 200 at the deterioration points.

The first relational expression acquired by the relational expression acquiring unit 110 will be described next. Specifically, the second and third relational expressions acquired by the relational expression acquiring unit 110 will be described below.

FIGS. 4, 5(a), and 5(b) are explanatory graphs on the first relational expression acquired by the relational expression acquiring unit 110 according to the embodiment of the present invention. Specifically, FIG. 4 is a graph of relation between the cycle number and the discharge capacity of the energy storage device 200 that is charged and discharged repeatedly. FIGS. 5(a) and 5(b) are graphs indicating deterioration in discharge capacity of the energy storage device 200.

Line A in FIG. 4 indicates transition of energy storage capacity Q as discharge capacity of the energy storage device 200 that is discharged at the predetermined first current. Line B indicates transition of equilibrial capacity $Q_e$ as discharge capacity of the energy storage device 200 that is discharged at the second current of a current value smaller than that of the first current.

The first current can be the constant current of 1 CA, and the energy storage capacity Q can be discharge capacity of a case where a 1 C capacity validation test is performed (e.g. the energy storage device is discharged to 2.75 V at the constant current of 1 CA from the state where the energy storage device is fully charged to 4.1 V). The second current is ideally a current of a current value most approximate to zero. The equilibrial capacity $Q_e$ can be discharge capacity obtained in accordance with an open circuit voltage (OCV) curve of a case of intermittently discharging at 0.05 C (hereinafter, also referred to as "intermittent discharge capacity"), or can be charge capacity of a case of performing at constant-current constant-voltage (CCCV) charging at 0.05 C. The first current is preferably a constant current from 0.5 to 2 CA, whereas the second current preferably has a current value corresponding to a constant current from 0 to 0.1 CA.

An equilibrial capacity decreased amount $Q_t$ is obtained by subtracting the equilibrial capacity $Q_e$ from initial capacity $Q_0$ of the energy storage device 200. In other words, the equilibrial capacity decreased amount $Q_t$ is a difference of the equilibrial capacity $Q_e$ at the predetermined deterioration point from the initial state.

A kinetic capacity decreased amount $Q_k$ is obtained by subtracting the energy storage capacity Q from the equilibrial capacity $Q_e$. In other words, the kinetic capacity decreased amount $Q_k$ is obtained by subtracting the equilibrial capacity decreased amount $Q_t$ from a capacity decreased amount $Q_d$ as a decreased amount from the initial capacity $Q_0$ of the energy storage capacity Q. The capacity decreased amount $Q_d$ is a difference of the energy storage capacity Q at the predetermined deterioration point from the initial state.

The energy storage capacity Q is thus expressed by Equation 1.

$$Q=Q_0-Q_d=Q_0-(Q_t+Q_k) \quad \text{(Equation 1)}$$

Figure 5:
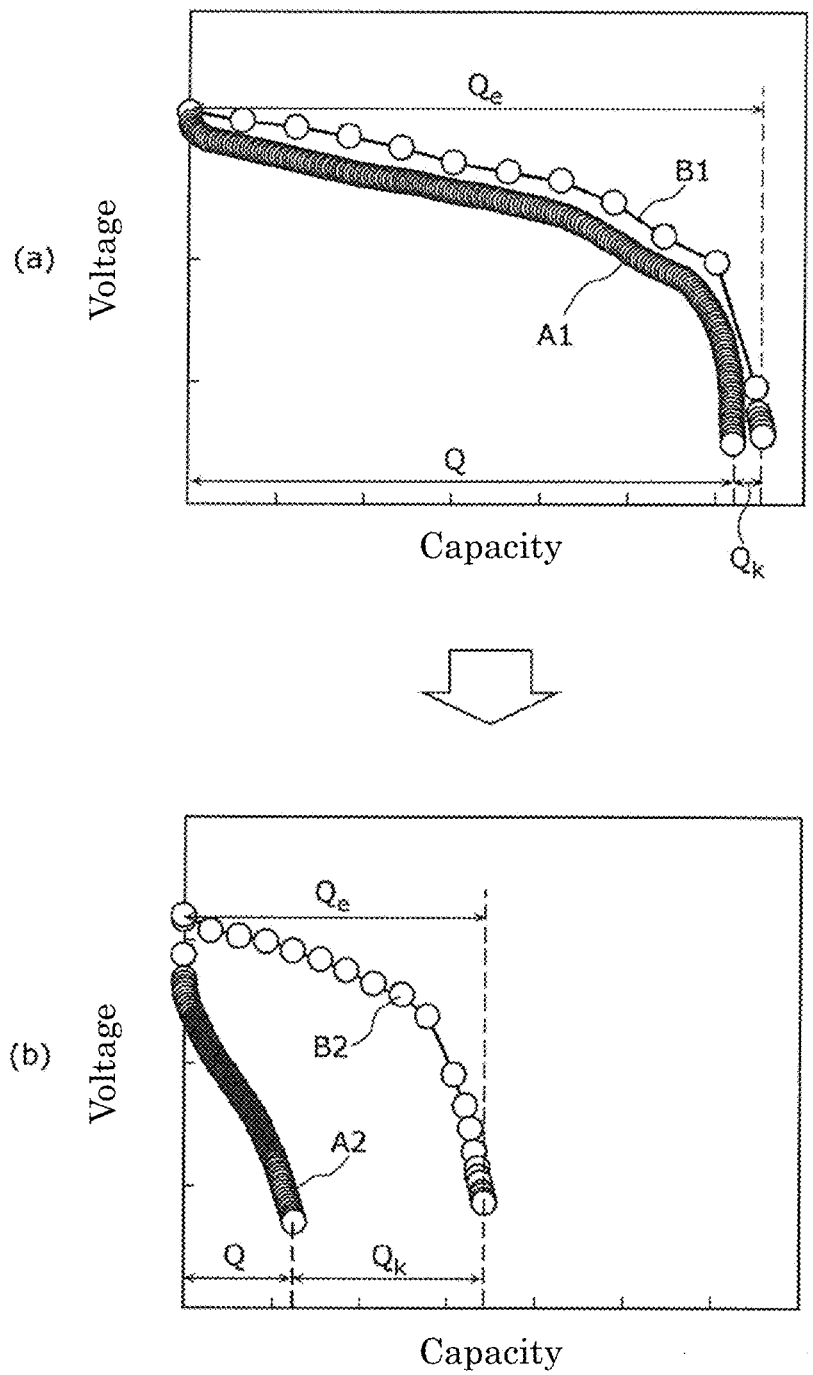
FIGS. 5(*a*) and 5(*b*) are explanatory graphs on the first relational expression acquired by the relational expression acquiring unit according to the embodiment of the present invention.

When deterioration progresses from the state indicated in FIG. 5(a) to the state indicated in FIG. 5(b), as indicated in FIG. 5, the equilibrial capacity $Q_e$ and the energy storage capacity Q decrease. FIG. 5(a) is a graph of the discharge capacity of the energy storage device 200 in the initial state, whereas FIG. 5(b) is a graph of the discharge capacity of the energy storage device 200 deteriorated at the end of its life. Lines A1 and A2 in these graphs each indicate transition of a close circuit voltage during discharge, whereas lines B1 and B2 each indicate transition of an open circuit voltage during discharge.

Assume a lithium-ion secondary battery of design capacity of 600 mAh, having the equilibrial capacity $Q_e$ decreased to approximately one half and energy storage capacity Q decreased to approximately one-fifth when a 1 C cycle test at 45° C. in a state of charge (SOC) in the range from 0 to 100% is performed for 1350 cycles. In this case, the kinetic capacity decreased amount $Q_k$ increases drastically.

The kinetic capacity decreased amount $Q_k$ and the equilibrial capacity $Q_e$ are assumed to have close relation with a resistance value R of a direct or alternating current of the battery, although it has been difficult to find details of the relation.

The inventors of the present application have found, through intensive studies and tests, that a capacity ratio $r_g$ as a ratio of the kinetic capacity decreased amount $Q_k$ to a value (the equilibrial capacity $Q_e$) obtained by subtracting the equilibrial capacity decreased amount $Q_t$ from the initial capacity $Q_0$ is in proportion to the resistance value R, as expressed in Equation 2.

$$r_g=Q_k/(Q_0-Q_t)=a\times R+b \quad \text{(Equation 2)}$$

According to the present embodiment, coefficients a and b are constants and the resistance value R relates to direct current resistance or alternating current resistance of the energy storage device 200. Equation 2 on the capacity ratio $r_g$ expressed by a linear function of the resistance value R corresponds to the second relational expression acquired by the relational expression acquiring unit 110. The coefficients a and b vary depending on whether the resistance value R relates to direct current resistance or alternating current resistance.

The second relational expression is preliminarily obtained through a test to be described below for each type of the energy storage device 200 and is preliminarily stored in the relational expression data 131 in the storage unit 130. The constants a and b in Equation 2 are calculated for each type of the energy storage device 200. The test performed for obtaining the second relational expression will be described below.

Preliminarily performed are sample tests (including a cycle test, a shelf test, and various tests of combination thereof) under simulated expectable operation conditions (including a prescribed current value) on an energy storage device 200 configured identically with the energy storage device 200 of which post-deterioration capacity is to be estimated. For example, a 1 C cycle life test is performed at 45° C.

The equilibrial capacity decreased amount $Q_t$ is measured through a 0.05 C intermittent discharge test until the energy storage device deteriorates into a certain deterioration state. The kinetic capacity decreased amount $Q_k$ is calculated by subtracting 1 C discharge capacity from 0.05 C intermittent discharge capacity. For example, the following data is acquired after 150, 200, and 400 cycles.

(a) The equilibrial capacity decreased amount $Q_t$ acquired in accordance with a known method.
(b) The kinetic capacity decreased amount $Q_k$ acquired through a 1 C discharge capacity validation test.

The capacity ratio $r_g=Qk/(Q_0-Q_t)$ (where $Q_0$ is the initial capacity (or the initial equilibrial capacity) of a case of discharging at a rate most approximate to the current 0) is calculated from the equilibrial capacity decreased amount $Q_t$ and the kinetic capacity decreased amount $Q_k$ thus acquired.

The resistance value R of direct current resistance or alternating current resistance is acquired until the energy storage device deteriorates into a certain deterioration state. For example, 1 kHz alternating current resistance or direct current resistance at the tenth second is acquired after 100, 200, and 400 cycles. The 1 kHz alternating current resistance is the alternating current resistance (alternating current impedance) measured by applying an alternating current voltage or an alternating current at the frequency of 1 kHz to the energy storage device 200. The direct current resistance at the tenth second is measured in accordance with a slant of a voltage-current (V-I) plot at the tenth second. A method of acquiring the resistance value R of direct current resistance or alternating current resistance is to be described later.

A linear function of $r_g = a \times R + b$ is calculated from the capacity ratio $r_g$ and the resistance value R thus acquired, and values of the constants a and b are obtained.

A method of acquiring the equilibrial capacity decreased amount $Q_t$ of the data (a) will be described below.

Figure 6A:
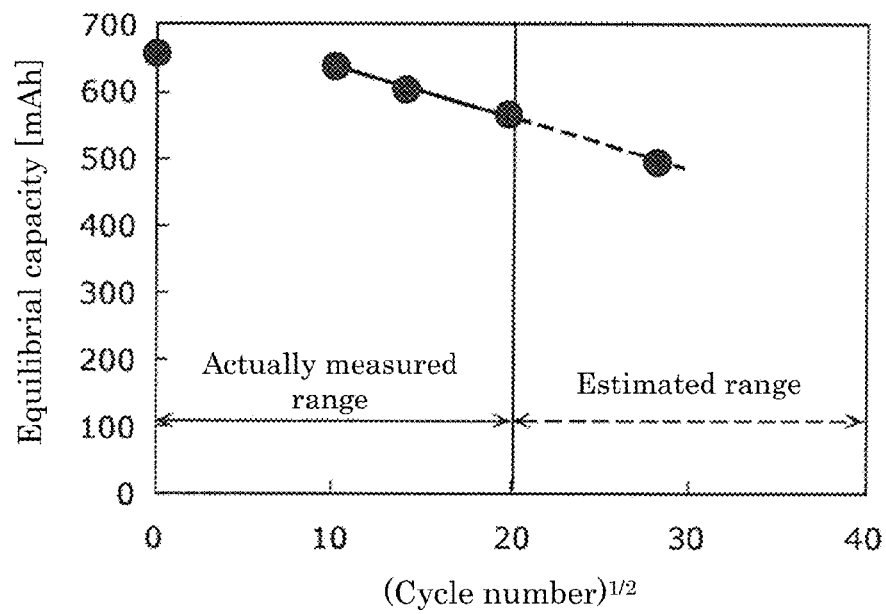
FIG. 6A is a graph specifically exemplifying equilibrial capacity according to the embodiment of the present invention.
Figure 6B:
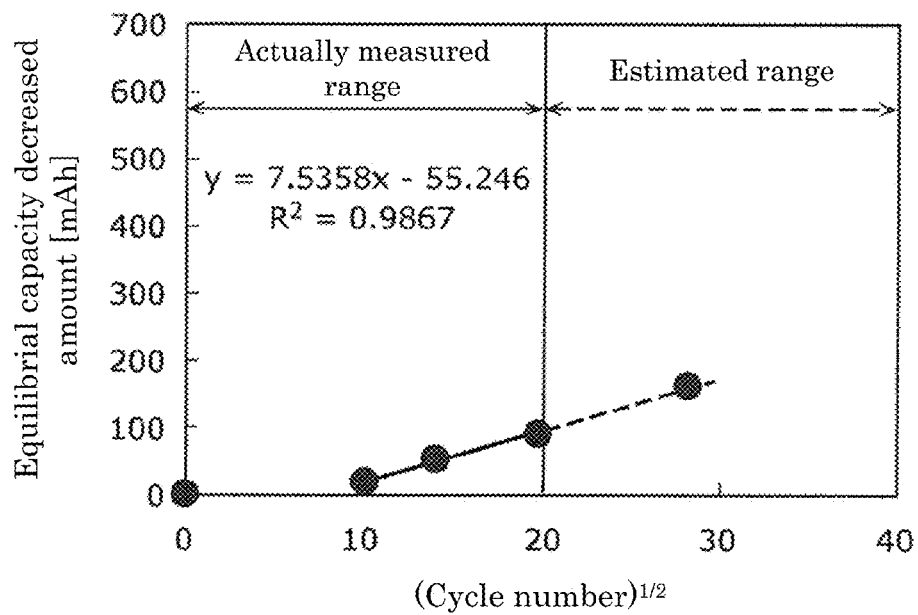
FIG. 6B is a graph specifically exemplifying an equilibrial capacity decreased amount according to the embodiment of the present invention.

FIGS. 6A and 6B are graphs specifically exemplifying the equilibrial capacity and the equilibrial capacity decreased amount according to the embodiment of the present invention. Specifically, FIG. 6A is a graph of relation between the equilibrial capacity and the root of the cycle number, whereas FIG. 6B is a graph of relation between the equilibrial capacity decreased amount and the root of the cycle number.

A lithium-ion secondary battery used in the following specific examples includes a positive electrode, a negative electrode, and a nonaqueous electrolyte. The positive electrode has a positive electrode current collector made of aluminum foil and a positive composite provided thereon. The positive composite includes a positive active material, polyvinylidene fluoride serving as a binding agent, and acetylene black serving as a conductive material.

The positive active material is a mixture of layered lithium transition metal oxide expressed as $LiNi_{1/3}Co_{1/3}Mn_{1/3}O_2$ and spinel lithium-manganese oxide. The negative electrode has a negative electrode current collector made of copper foil and a negative composite provided thereon. The negative composite includes a graphite carbon material serving as a negative active material and polyvinylidene fluoride serving as a binding agent.

The layered lithium transition metal oxide and the spinel lithium-manganese oxide in the positive active material are mixed at the mass ratio of 3:7 in the following specific examples. A similar result will be obtained at any mixture ratio.

In the examples of FIGS. 6A and 6B, after the 1 C cycle test at 45° C. and the SOC ranging from 0 to 100% (2.75 to 4.1 V) is performed for 800 cycles (about six months), the equilibrial capacity decreased amount $Q_t$ of the battery is acquired through the 0.05 C intermittent discharge test and $Q_t$ is calculated as a root function having a cumulative operating period t as a variable.

Specifically, in the 1 C cycle life test at 45° C., the 0.05 C intermittent discharge capacity validation test at 25° C. is performed after 100, 200, and 400 cycles except for zero cycles, the root function $Q_t = c \times t^{0.5} + d$ is calculated and coefficients c and d are obtained. The 0.05 C intermittent discharge capacity is measured for 25 times by performing intermittent constant-current constant-voltage charge at the current rate of 0.05 C with energizing time of one hour and downtime of three hours, and is measured for 25 times by performing intermittent constant-current discharge at the current rate of 0.05 C with energizing time of one hour and downtime of three hours.

Accordingly obtained is the relational expression on the equilibrial capacity decreased amount $Q_t = 7.54 \times t^{0.5} - 55.25$.

In a case where the equilibrial capacity decreased amount $Q_t$ varies significantly, the equilibrial capacity decreased amount $Q_t$ can be calculated as a (root+ exponent) function. For example, the (root+ exponent) function $Q_t = [e \times t^{0.5} + f] + [g \times \exp(h \times t)]$ can be calculated under the similar test conditions to obtain coefficients e, f, g, and h.

The second relational expression will be specifically exemplified next. A lithium-ion secondary battery used in the following specific examples is similar to that mentioned above.

Figure 7A:
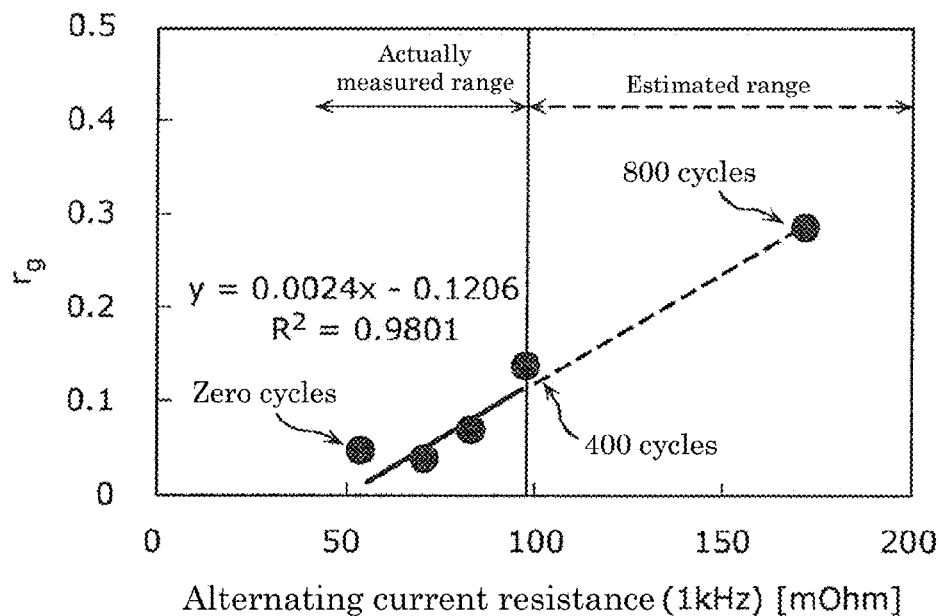
FIG. 7A is a graph specifically exemplifying a second relational expression acquired by the relational expression acquiring unit according to the embodiment of the present invention.
Figure 7B:
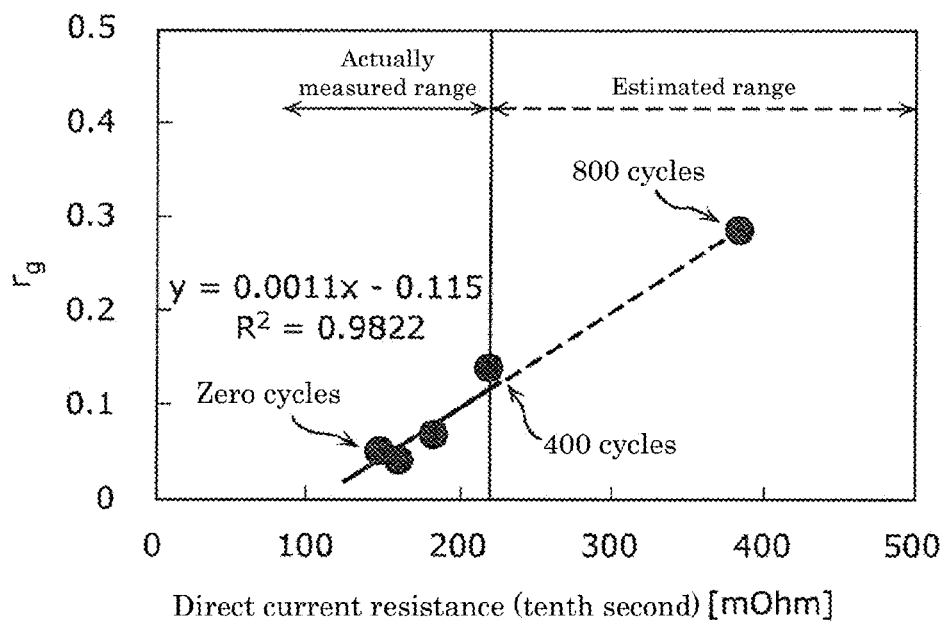
FIG. 7B is a graph specifically exemplifying the second relational expression acquired by the relational expression acquiring unit according to the embodiment of the present invention.

FIGS. 7A and 7B are graphs specifically exemplifying the second relational expression acquired by the relational expression acquiring unit 110 according to the embodiment of the present invention. Specifically, FIG. 7A is a graph of relation between the capacity ratio and resistance value of the 1 kHz alternating current resistance of the battery in a case where the 1 C discharge capacity validation test is performed in the 1 C cycle test at 45° C. FIG. 7B is a graph of relation between the capacity ratio and the resistance value of the direct current resistance at the tenth second of the battery in a case similar to that of FIG. 7A. Plots in these graphs have actually measured values. The equilibrial capacity is acquired through the 0.05 C intermittent discharge test in each case.

As indicated in FIG. 7A, linear approximation is initially applied to the relation between the capacity ratio $r_g$ and the alternating current (1 kHz) resistance value R in accordance with the test results until 400 cycles to obtain the second relational expression $r_g = 0.0024 \times R - 0.1206$. The capacity ratio $r_g$ at 800 cycles is calculated in accordance with the second relational expression to obtain the estimated value $r_g = 0.309$. This estimated value has the error of +0.021 from the actually measured value 0.288 and is approximate to the actually measured value.

As indicated in FIG. 7B, linear approximation is applied to the relation between the capacity ratio $r_g$ and the resistance value R of the direct current resistance at the tenth second from the start of discharge in accordance with the test results until 800 cycles to obtain the second relational expression $r_g = 0.0011 \times R - 0.115$. The capacity ratio $r_g$ at 800 cycles is calculated in accordance with the second relational expression to obtain the estimated value $r_g = 0.306$. This estimated value has the error of +0.018 from the actually measured value 0.288 and is approximate to the actually measured value.

The 1 C cycle test is performed under the following conditions. Charge is performed by constant-current constant-voltage charge at the current of 1 CmA (=600 mA) and the voltage of 4.1 V with charging time of three hours. Discharge is performed by constant-current discharge at the current of 1 CmA (=600 mA) and the final voltage of 2.75 V. Downtime for 10 minutes is provided between charge and discharge as well as between discharge and charge. The battery is kept in the open circuit state for such downtime. One cycle accordingly includes the four steps of charge, a pause, discharge, and a pause.

Specifically, the 1 C discharge capacity (the energy storage capacity Q) and the 0.05 C intermittent discharge capacity (the equilibrial capacity $Q_e = Q_0 - Q_t$) of each battery are measured and the discharge capacity (the kinetic capacity decreased amount $Q_k$) is calculated by subtracting the 1 C discharge capacity from the 0.05 C intermittent discharge capacity, to calculate the capacity ratio $r_g = Q_k/(Q_0 - Q_t)$. The resistance value R of the 1 kHz alternating current resistance or the direct current resistance at the tenth second is also measured to obtain a linear function.

The 1 C discharge capacity is measured by performing constant-current constant-voltage charge to 4.1 V and constant-current discharge to 2.75 V for three hours. The 0.05 C intermittent discharge capacity is measured for 25 times by performing intermittent constant-current constant-voltage charge at the current rate of 0.05 C with energizing time of one hour and downtime of three hours, and is measured for 25 times by performing intermittent constant-current discharge at the current rate of 0.05 C with energizing time of one hour and downtime of three hours.

The resistance value R of the 1 kHz alternating current resistance is measured by performing constant-current discharge at 0.05 C and the SOC of 0% to 2.75 V. Regarding direct current resistance at the tenth second, the SOC is adjusted by performing constant-current constant-voltage charge at 0.2 CA to the SOC of 50% for eight hours in total and energization is performed for ten seconds at the current rates of 0.2, 0.5, and 1 CA as discharge rates.

The inventors of the present application have found, through intensive studies and tests, that the resistance value R of direct current resistance or alternating current resistance of the energy storage device 200 is expressed by an exponential function of the cumulative operating period t of the energy storage device 200, as in Equation 3.

$$R = f(t) = \exp(A \times t + B) = C \times \exp(A \times t) \quad \text{(Equation 3)}$$

Coefficients A, B, and C according to the present embodiment are constants (C=exp (B)), and the coefficients A, B, and C vary depending on whether the resistance value R relates to direct current resistance or alternating current resistance. Equation 3 on the resistance value R expressed by the exponential function of the cumulative operating period t corresponds to the third relational expression acquired by the relational expression acquiring unit 110.

The third relational expression is preliminarily obtained through a test to be described below for each type of the energy storage device 200 and is preliminarily stored in the relational expression data 131 in the storage unit 130. The constants A and B in Equation 3 are calculated for each type of the energy storage device 200. The test performed for obtaining the third relational expression will be described below.

Specifically, under operation conditions (including a prescribed current value) for expectable repeated operation, an exponential correlation function expression R=f (t) is calculated from transition of the resistance value R of direct current resistance or alternating current resistance to the cumulative operating period until a certain deterioration state.

For example, direct current resistance or alternating current resistance is measured after 100, 200, and 400 cycles to acquire paired data (the resistance value R and the cumulative operating period t). The relation therebetween is substituted in R=exp (A×t+B) or R=C× exp (A×t) to calculate the coefficients A and B or the coefficients A and C.

Figure 8A:
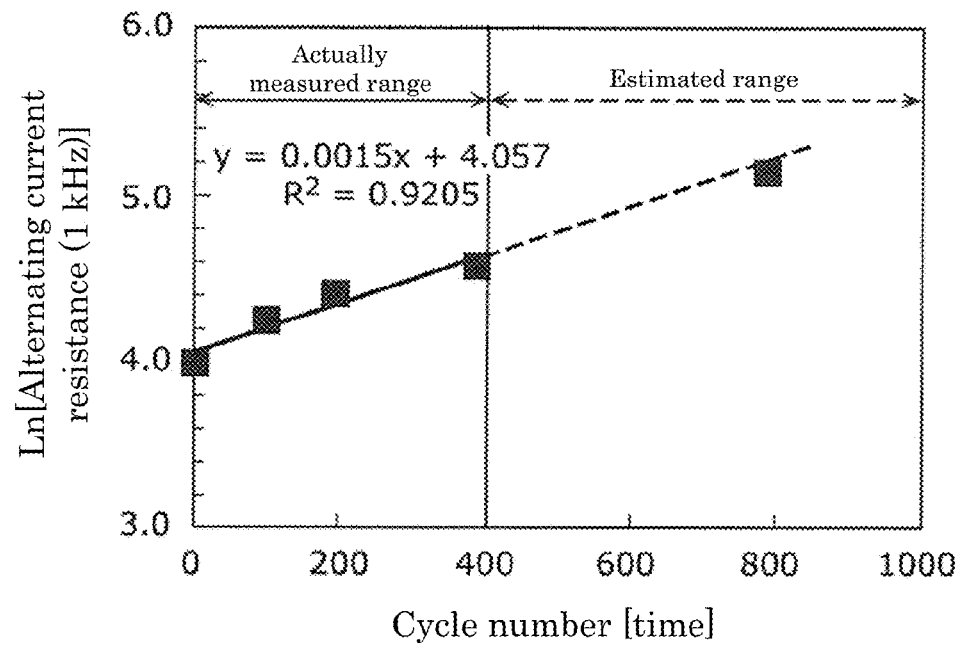
FIG. 8A is a graph specifically exemplifying a third relational expression acquired by the relational expression acquiring unit according to the embodiment of the present invention.
Figure 8B:
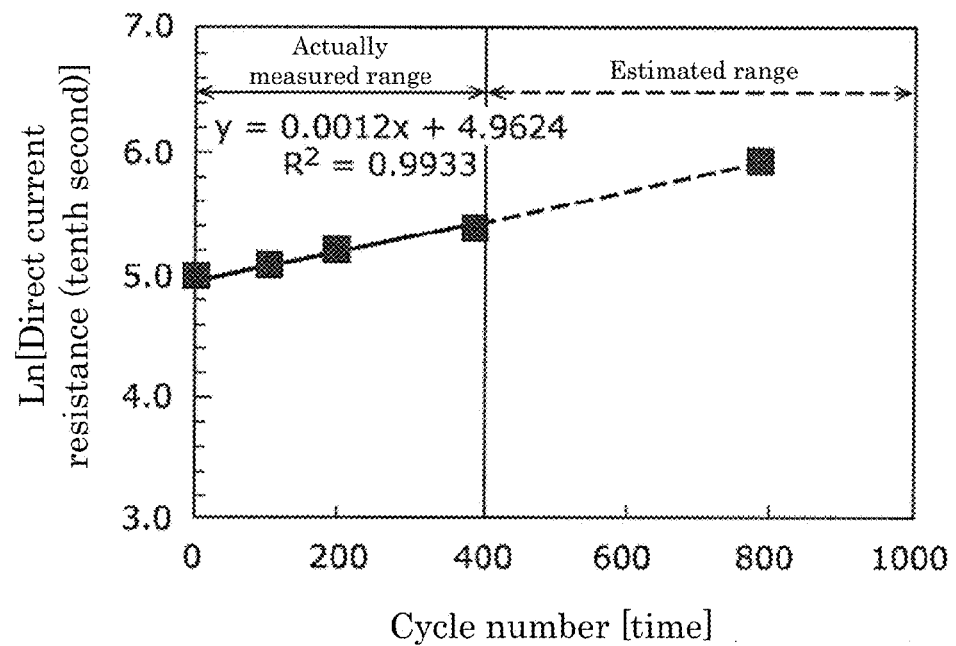
FIG. 8B is a graph specifically exemplifying the third relational expression acquired by the relational expression acquiring unit according to the embodiment of the present invention.

FIGS. 8A and 8B are graphs specifically exemplifying the third relational expression acquired by the relational expression acquiring unit 110 according to the embodiment of the present invention. Specifically, FIG. 8A is a graph of relation between the logarithm of resistance value of the 1 kHz alternating current resistance and the cycle number in the 1 C cycle test at 45° C. FIG. 8B is a graph of relation between the logarithm of the resistance value of the direct current resistance at the tenth second and the cycle number in a case similar to that of FIG. 8A. Plots in these graphs have actually measured values. A lithium-ion secondary battery applied in this case is similar to that of the second relational expression.

As indicated in FIG. 8A, linear approximation is initially applied to the relation between the logarithm of the alternating current (1 kHz) resistance value R and the cycle number (cumulative operating period) t in accordance with the test results until 400 cycles to obtain the third relational expression R=exp (0.0015×t+4.06). The resistance value R at 800 cycles is calculated in accordance with the third relational expression to obtain the estimated value R=192.5.

This estimated value has the error of +21.0 from the actually measured value 171.5 and is approximate to the actually measured value.

As indicated in FIG. 8B, linear approximation is applied to the relation between the logarithm of the resistance value R of direct current resistance and the cycle number (cumulative operating period) t in accordance with the test results until 400 cycles to obtain the third relational expression R=exp (0.0012×t+4.96). The resistance value R at 800 cycles is calculated in accordance with the third relational expression to obtain the estimated value R=372.4. This estimated value has the error of +5.8 from the actually measured value 366.6 and is approximate to the actually measured value.

The resistance value R can be measured by the following exemplary method. The collected battery is left at 25° C. for at least three hours and constant-current discharge (residual discharge) is performed at 0.05 CA as battery rated capacity until the SOC reaches 0%.

In order to acquire the resistance value R of direct current resistance, constant-current constant-voltage charge is performed at 0.2 CA for eight hours in total until the SOC reaches 50%. Voltages (V) at the tenth second and discharge currents of at least three points such as 0.2, 0.5, and 1 CA are then plotted to the discharge currents (I), respectively, to check that slants thereof have linearity and acquire the resistance value R of direct current resistance from the slant of the V-I plot.

In order to acquire the resistance value R of alternating current resistance, internal impedance (SOC: 0%) of a battery of 1 kHz or the like is acquired using an alternating current impedance measuring device.

In these manners, Equation 3 can be obtained as the third relational expression that is acquired by the relational expression acquiring unit 110. In this relational expression, the resistance value R of direct current resistance or alternating current resistance of the energy storage device 200 at a time point after elapse of the cumulative operating period t as the cumulative value of the operating period of the energy storage device 200 is in proportion to an exponential function having the variable obtained by multiplying the cumulative operating period t and the predetermined coefficient A.

The graph of Equation 3 has the resistance value R that suddenly increases as the cumulative operating period t elapses at the end of the battery life, and can correctly express the deterioration state of the battery with the resistance value R acceleratingly increasing at the end of the battery life. At the end of the battery life, internal resistance of the battery increases by at least three times of the initial value, for example.

The processes of estimating post-deterioration capacity of the energy storage device 200 with the post-deterioration performance estimating apparatus 100 will be described next.

Figure 9:
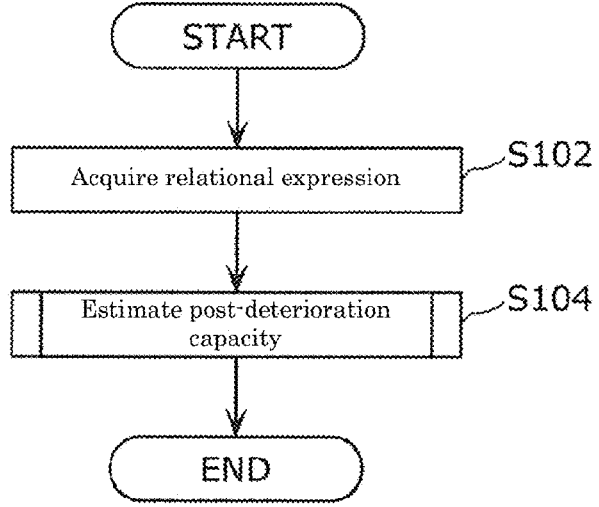
FIG. 9 is a flowchart of exemplary processes of estimating post-deterioration capacity of an energy storage device with the post-deterioration performance estimating apparatus according to the embodiment of the present invention.
Figure 10:
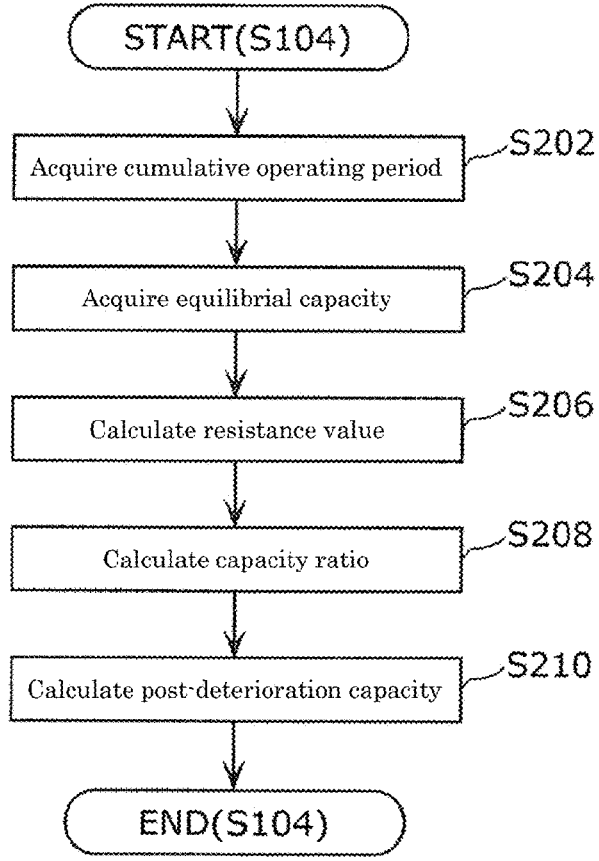
FIG. 10 is a flowchart of exemplary processes of estimating post-deterioration capacity of an energy storage device with the post-deterioration performance estimating apparatus according to the embodiment of the present invention.

FIGS. 9 and 10 are flowchart of exemplary processes of estimating the post-deterioration capacity of the energy storage device 200 with the post-deterioration performance estimating apparatus 100 according to the embodiment of the present invention.

As depicted in FIG. 9, the relational expression acquiring unit 110 initially acquires a relational expression corresponding to the type of the energy storage device 200 of which post-deterioration capacity is to be estimated (S102). Specifically, the relational expression acquiring unit 110 acquires the first relational expression including the second and third relational expressions corresponding to the type of the energy storage device 200 with reference to the relational expression data 131 stored in the storage unit 130.

In other words, the relational expression acquiring unit 110 acquires the first relational expression including the second relational expression (Equation 2) on the capacity ratio as the ratio of the kinetic capacity decreased amount to the equilibrial capacity being expressed by the linear function of the resistance value and the third relational expression (Equation 3) on the resistance value at the time point after elapse of the cumulative operating period being in proportion to the exponential function having the variable obtained by multiplying the cumulative operating period and the predetermined coefficient.

The post-deterioration performance estimator 120 then estimates the post-deterioration capacity as the energy storage capacity at the predetermined deterioration point in accordance with the first relational expression acquired by the relational expression acquiring unit 110 and the cumulative operating period of the energy storage device 200 at the deterioration point (S104). The processes of estimating the post-deterioration capacity with the post-deterioration performance estimator 120 will be described in detail below. FIG. 10 is a flowchart of the exemplary process (S104 in FIG. 9) of estimating the post-deterioration capacity with the post-deterioration performance estimator 120 according to the embodiment of the present invention.

As depicted in FIG. 10, the data acquiring unit 121 initially acquires the cumulative operating period of the energy storage device 200 at the deterioration point (S202). Specifically, the data acquiring unit 121 acquires the cumulative operating period t, at the deterioration point, of the energy storage device 200 of which post-deterioration capacity is to be estimated. The data acquiring unit 121 can measure to acquire the cumulative operating period t, or can acquire the same from outside, which is inputted by a user, for example. The data acquiring unit 121 then stores the acquired cumulative operating period t of the energy storage device 200 in the energy storage device data 132 in the storage unit 130.

The data acquiring unit 121 acquires the equilibrial capacity of the energy storage device 200 at the deterioration point (S204). Specifically, the data acquiring unit 121 acquires the equilibrial capacity $Q_e$, at the deterioration point, of the energy storage device 200 of which post-deterioration capacity is to be estimated. The data acquiring unit 121 calculates the equilibrial capacity decreased amount $Q_t$ from the cumulative operating period t in accordance with the relational expression described above with reference to FIGS. 6A and 6B, to acquire the equilibrial capacity $Q_e$ in accordance with $Q_e=Q_0-Q_t$. The data acquiring unit 121 then stores the acquired equilibrial capacity $Q_e$ in the energy storage device data 132 in the storage unit 130.

Alternatively, the data acquiring unit 121 can perform CCCV charge for an adequate period (e.g. charge at 0.2 CA for ten hours) after residual discharge at 0.05 C and measure to acquire an amount of charge at this time point as the equilibrial capacity $Q_e$. These acquiring methods are particularly preferred for a lithium-ion secondary battery that is characterized by having an amount of charge and discharge capacity substantially equal to each other (coulomb efficiency of 100%) from the initial stage to the end of its life, and does not require intermittent discharge at 0.05 C. The data acquiring unit 121 can alternatively acquire the equilibrial capacity $Q_e$ from outside, which is inputted by a user, for example.

The resistance value calculator 122 subsequently calculates the resistance value at the deterioration point in accordance with the cumulative operating period acquired by the data acquiring unit 121 and the third relational expression (S206). Specifically, the resistance value calculator 122 reads out the cumulative operating period and the third relational expression from the storage unit 130 and substitutes the cumulative operating period t in the third relational expression provided as Equation 3 to calculate the resistance value R. The resistance value calculator 122 then stores the calculated resistance value R in the energy storage device data 132 in the storage unit 130.

The capacity ratio calculator 123 then calculates the capacity ratio at the deterioration point in accordance with the resistance value calculated by the resistance value calculator 122 and the second relational expression. Specifically, the capacity ratio calculator 123 reads out the resistance value and the second relational expression from the storage unit 130 and substitutes the resistance value R in the second relational expression provided as Equation 2 to calculate the capacity ratio $r_g$. The capacity ratio calculator 123 then stores the calculated capacity ratio $r_g$ in the energy storage device data 132 in the storage unit 130.

The post-deterioration performance calculator 124 then calculates the post-deterioration capacity in accordance with the fourth relational expression on the relation among the post-deterioration capacity, the equilibrial capacity acquired by the data acquiring unit 121, and the capacity ratio calculated by the capacity ratio calculator 123 (S210).

The fourth relational expression is provided as Equation 4 that is obtained through the following process.

$$\begin{aligned} Q &= Q_0 - (Q_t + Q_k) & \text{(Equation 4)} \\ &= Q_0 - \{Q_t + r_g \times (Q_0 - Q_t)\} \\ &= Q_0 - Q_t - r_g \times (Q_0 - Q_t) \\ &= (1 - r_g) \times (Q_0 - Q_t) \\ &= (1 - a \times R - b) \times (Q_0 - Q_t) \end{aligned}$$

Specifically, the post-deterioration performance calculator 124 calculates post-deterioration capacity Q by multiplying a value obtained by subtracting the capacity ratio $r_g$ (=a×R+b) from one and the equilibrial capacity $Q_e$ (=$Q_0-Q_t$). In this manner, the post-deterioration performance calculator 124 reads out the equilibrial capacity $Q_e$ and the capacity ratio $r_g$ from the storage unit 130 and substitutes these values in the fourth relational expression to calculate the post-deterioration capacity Q.

The fourth relational expression is stored in the relational expression data 131 in the storage unit 130. The post-deterioration performance calculator 124 can be configured to calculate the post-deterioration capacity Q in accordance with the fourth relational expression if the relational expression acquiring unit 110 acquires the fourth relational expression.

The processes of estimating the post-deterioration capacity of the energy storage device 200 with the post-deterioration performance estimating apparatus 100 thus end.

Effects exerted by the post-deterioration performance estimating apparatus 100 according to the embodiment of the present invention will be described next. Specifically, the fact that the post-deterioration performance estimating apparatus 100 can accurately estimate the post-deterioration capacity of the energy storage device 200 will be described.

Figure 11:
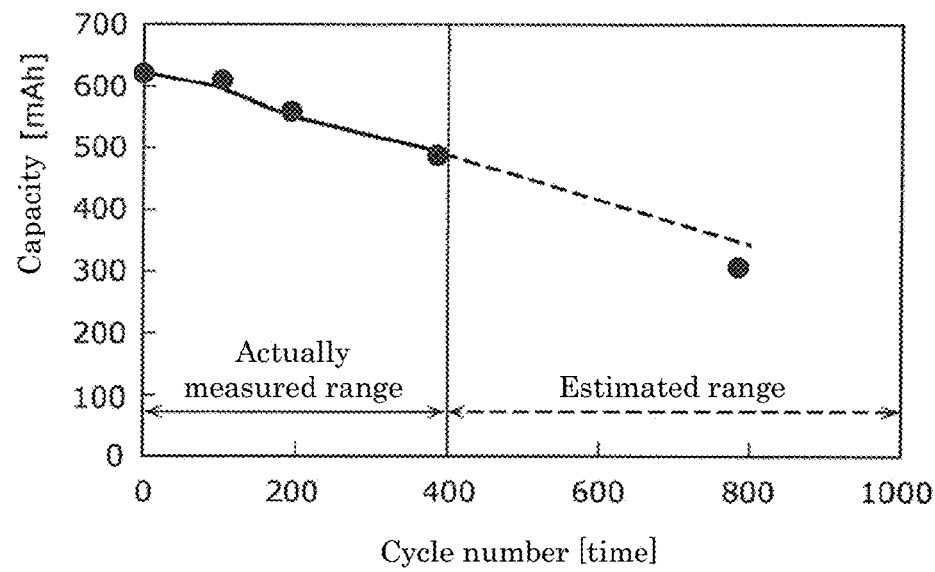
FIG. 11 is an explanatory graph on effects exerted by the post-deterioration performance estimating apparatus according to the embodiment of the present invention.
Figure 12:
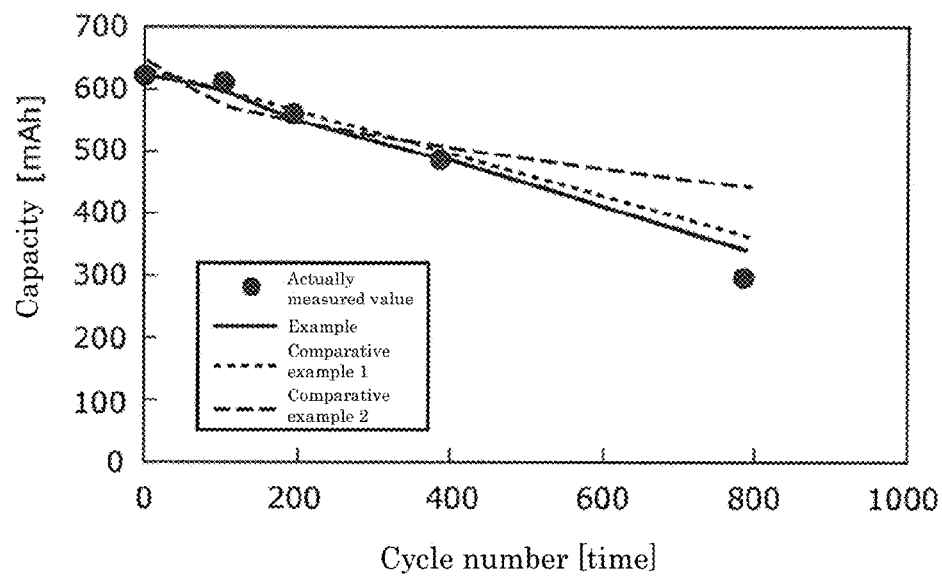
FIG. 12 is an explanatory graph on effects exerted by the post-deterioration performance estimating apparatus according to the embodiment of the present invention.

FIGS. 11 to 13 are explanatory figures on the effects exerted by the post-deterioration performance estimating apparatus 100 according to the embodiment of the present invention.

Initially calculated is an equilibrial capacity decreased amount $Q_t$ of a battery configured identically with the battery of which post-deterioration capacity is to be estimated. Applied to the battery of which post-deterioration capacity is to be estimated is the 1 C cycle test at 45° C. and the SOC ranging from 0 to 100% (2.75 to 4.1 V) for 800 cycles (about six months) (the initial capacity $Q_0$=653.1 mAh). Specifically, the value t=800 is substituted in $Q_t$=7.54×$t^{0.5}$−55.25 indicated in FIG. 6B to calculate the equilibrial capacity decreased amount $Q_t$=158.0 mAh.

The second relational expression $r_g$=0.0011×R−0.115 indicated in FIG. 7B and the third relational expression R=exp (0.0012×t+4.96) indicated in FIG. 8B are acquired as the first relational expression. The value t=800 is substituted in the third relational expression to calculate the resistance value R=372.4 mOhm. The resistance value R is then substituted in the second relational expression to calculate the capacity ratio $r_g$=0.2946.

The initial capacity $Q_0$, the equilibrial capacity decreased amount $Q_t$, and the capacity ratio $r_g$ are substituted in the fourth relational expression to calculate the post-deterioration capacity Q=349.2 mAh. As indicated in FIGS. 11 and 13, the post-deterioration capacity Q is approximate to the actually measured value 303.3 mAh (with the estimated error+45.9 mAh). The plots in the graph have actually measured values.

In comparative examples, the post-deterioration capacity is calculated in accordance with the conventionally applied methods. Specifically, with the battery at 800 cycles to which a 1 C cycle test similarly to the above is applied, a prediction expression is obtained in accordance with each of the linear law (a comparative example 1) and the root law (a comparative example 2) to calculate post-deterioration capacity at 800 cycles. Calculation results thereof will be described below.

COMPARATIVE EXAMPLE 1

Linear Law

With reference to Patent Document 1, the following linear function is obtained from transition of the 1 C capacity and the cycle number of the battery until a certain deterioration state to calculate 1 C capacity at 800 cycles.

$$Q = -0.327 \times t + 628.1$$
$$= -0.327 \times 800 + 628.1$$
$$= 366.5 \text{ mAh}$$

COMPARATIVE EXAMPLE 2

Root Law

With reference to Non-Patent Document 1, the following function is obtained from transition of the 1 C capacity and the root of the cycle number of the battery until a certain deterioration state to calculate 1 C capacity at 800 cycles.

$$Q = -6.71 \times t^{0.5} + 641.3$$
$$= -6.71 \times (800)^{0.5} + 641.3$$
$$= 451.5 \text{ mAh}$$

As indicated in FIGS. 12 and 13, the 1 C capacity according to the comparative example 1 has the estimated error 63.2 mAh from the actually measured value 303.3 mAh whereas the 1 C capacity according to the comparative example 2 has the estimated error 148.2 mAh. The post-deterioration performance estimating apparatus 100 according to the above embodiment can quite accurately estimate the post-deterioration capacity as compared with the conventionally applied methods.

As described above, the post-deterioration performance estimating apparatus 100 according to the embodiment of the present invention acquires the first relational expression on the relation among the initial capacity, the equilibrial capacity decreased amount, the kinetic capacity decreased amount, and the cumulative operating period of the energy storage device 200 and estimates the post-deterioration capacity as the discharge capacity of the energy storage device 200 at the predetermined deterioration point in accordance with the first relational expression and the cumulative operating period at the deterioration point. The inventors of the present application have found, through intensive studies and tests, that the post-deterioration capacity can be accurately estimated by separating the decreased amount in discharge capacity into the equilibrial capacity decreased amount and the kinetic capacity decreased amount and applying the first relational expression on the relation among the equilibrial capacity decreased amount, the kinetic capacity decreased amount, and the cumulative operating period of the energy storage device 200. The post-deterioration performance estimating apparatus 100 can thus accurately estimate the discharge capacity of the energy storage device 200 at the predetermined deterioration point.

The inventors of the present application have found, through intensive studies and tests, that the post-deterioration capacity can be accurately estimated by applying, as the first relational expression, the relational expression including the initial capacity, the equilibrial capacity decreased amount, the kinetic capacity decreased amount, and the member of the exponential function of the cumulative operating period. The post-deterioration performance estimating apparatus 100 can thus accurately estimate the discharge capacity of the energy storage device 200 at the predetermined deterioration point.

The inventors of the present application have found, through intensive studies and tests, that the post-deterioration capacity of the energy storage device 200 can be accurately calculated from the resistance value of the energy storage device 200 and the resistance value can be accurately calculated from the cumulative operating period of the energy storage device 200. The post-deterioration performance estimating apparatus 100 can thus accurately calculate the resistance value of the energy storage device 200 in accordance with the cumulative operating period and the third relational expression, and can accurately estimate the post-deterioration capacity of the energy storage device 200 in accordance with the resistance value and the second relational expression. The post-deterioration performance estimating apparatus 100 can thus accurately estimate the discharge capacity of the energy storage device 200 at the predetermined deterioration point.

The inventors of the present application have found, through intensive studies and tests, that the post-deterioration capacity can be accurately estimated by applying the second relational expression on the relation between the capacity ratio and the resistance value. The post-deterioration performance estimating apparatus 100 can thus accurately estimate the discharge capacity of the energy storage device 200 at the predetermined deterioration point.

The inventors of the present application have found, through intensive studies and tests, that the post-deterioration capacity can be accurately estimated by applying the second relational expression on the capacity ratio that is expressed by the linear function of the resistance value. The post-deterioration performance estimating apparatus 100 can thus accurately estimate the discharge capacity of the energy storage device 200 at the predetermined deterioration point.

The post-deterioration performance estimating apparatus 100 calculates the capacity ratio at the deterioration point in accordance with the resistance value at the deterioration point and the second relational expression, and calculates the post-deterioration capacity in accordance with the fourth relational expression on the relation among the post-deterioration capacity, the equilibrial capacity at the deterioration point, and the capacity ratio. In other words, the post-deterioration performance estimating apparatus 100 can accurately estimate the discharge capacity of the energy storage device 200 at the predetermined deterioration point in accordance with the second and fourth relational expressions.

The inventors of the present application have found, through intensive studies and tests, that the post-deterioration capacity can be accurately calculated by multiplying the value obtained by subtracting the capacity ratio from one and the equilibrial capacity. The post-deterioration performance estimating apparatus 100 can thus accurately estimate the discharge capacity of the energy storage device 200 at the predetermined deterioration point.

The resistance value of the energy storage device 200 acceleratingly increases as the cumulative operating period elapses. The inventors of the present application have found, through intensive studies and tests, that the relational expression on the resistance value in proportion to the exponential function having the variable obtained by multiplying the cumulative operating period and the predetermined coefficient accurately expresses a temporal change of the resistance value. The post-deterioration performance estimating apparatus 100 can thus correctly express the relation between the resistance value and the cumulative operating period by the third relational expression to accurately estimate the discharge capacity of the energy storage device 200 at the predetermined deterioration point.

The post-deterioration performance estimating apparatus 100 can calculate the resistance value at the deterioration point by acquiring the cumulative operating period at the deterioration point, and can thus accurately estimate the post-deterioration capacity of the energy storage device 200 from the resistance value.

The post-deterioration performance estimating apparatus 100 corrects the first relational expression and estimates the post-deterioration capacity in accordance with the corrected first relational expression. The post-deterioration performance estimating apparatus 100 can thus correctly estimate the post-deterioration capacity by correcting the first relational expression to improve accuracy of the first relational expression.

The energy storage device 200 is a lithium-ion secondary battery including layered lithium transition metal oxide as the positive active material. The inventors of the present application have found, through intensive studies and tests, that the first relational expression can accurately express the deterioration state if the energy storage device 200 is the lithium-ion secondary battery. The post-deterioration performance estimating apparatus 100 can thus correctly estimate the post-deterioration capacity of the lithium-ion secondary battery.

The post-deterioration performance estimating apparatus 100 can accurately estimate the discharge capacity of the energy storage device 200 at the predetermined deterioration point, and can thus correctly specify timing of replacing a lithium-ion secondary battery for a movable body or the like. Deterioration in capacity of the energy storage device 200 can be suppressed by charge-discharge control according to the estimated discharge capacity and the battery life can be thus extended.

MODIFICATION EXAMPLE 1

The modification example 1 of the embodiment of the present invention will be described next. The post-deterioration performance estimator 120 according to the above embodiment estimates the post-deterioration capacity of the energy storage device 200 in accordance with the relational expression acquired by the relational expression acquiring unit 110 without changing the relational expression. A post-deterioration performance estimator according to the present modification example corrects the relational expression and estimates the post-deterioration capacity.

Figure 14:
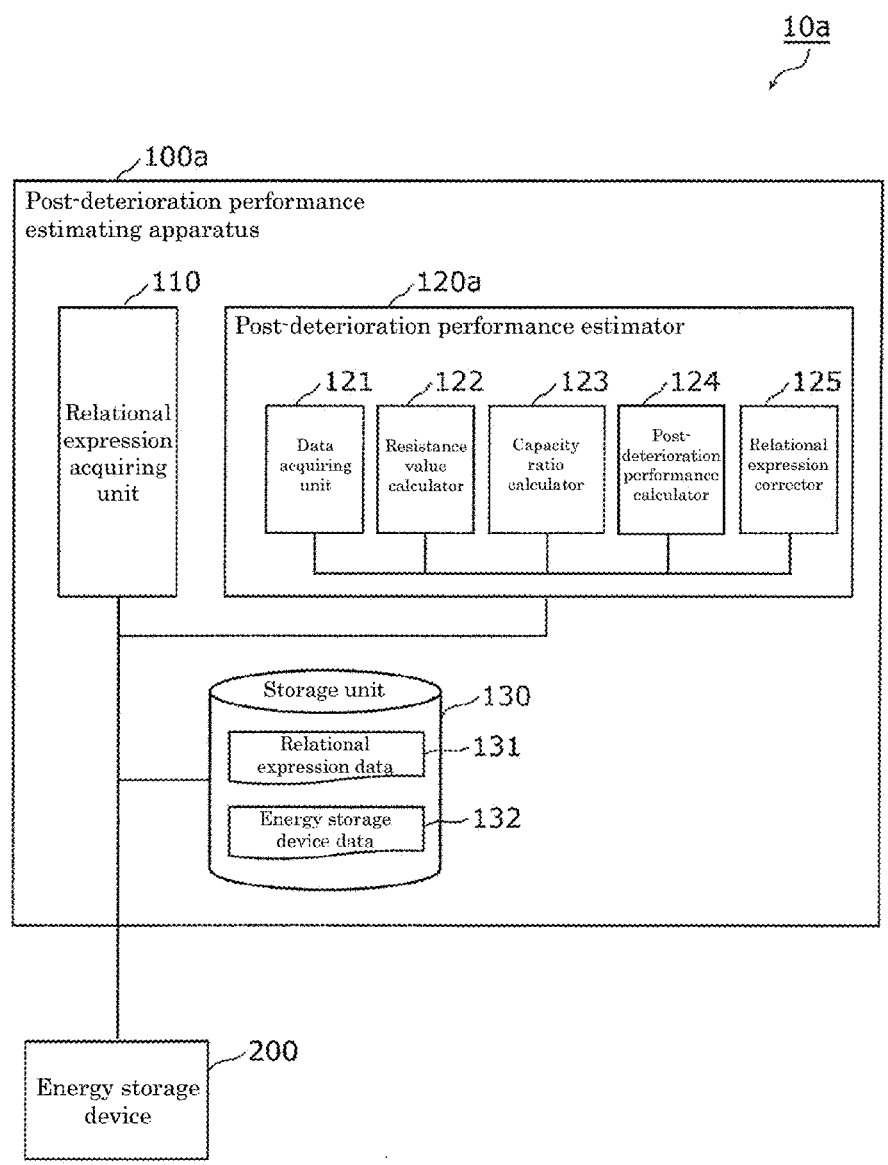
FIG. 14 is a block diagram depicting a configuration of a post-deterioration performance estimating apparatus according to a modification example 1 of the embodiment of the present invention.

FIG. 14 is a block diagram depicting a configuration of a post-deterioration performance estimating apparatus 100a according to the modification example 1 of the embodiment of the present invention.

As depicted in this figure, the post-deterioration performance estimating apparatus 100a provided in an energy storage system 10a includes a post-deterioration performance estimator 120a equipped with a relational expression corrector 125 configured to correct a relational expression acquired by the relational expression acquiring unit 110. The post-deterioration performance estimator 120a estimates the post-deterioration capacity in accordance with the relational expression corrected by the relational expression corrector 125. Specifically, the relational expression corrector 125 corrects the second and third relational expressions as the relational expressions used for calculating the equilibrial capacity decreased amount $Q_t$ from transition of each parameter acquired while a battery equipped apparatus or the like is in operation.

For example, the second relational expression can be corrected by acquiring paired data on the capacity ratio $r_g$ and the resistance value R while the battery is actually in operation in a vehicle or the like. The third relational expression can be corrected by acquiring paired data on the cumulative operating period t and the resistance value R similarly while the battery is actually in operation in a vehicle or the like.

Specifically, the relational expression corrector 125 recalculates the relational expression if a difference between a calculation result of substitution of certain measurement data in the second or third relational expression and different measurement data corresponding thereto exceeds a predetermined value.

The relational expression corrector 125 determines whether or not the difference exceeds the predetermined value. If the relational expression corrector 125 determines that the difference exceeds the predetermined value, the relational expression corrector 125 newly calculates a relational expression from measurement data until the cumulative operating period elapses, of the case where the difference exceeds the predetermined value. The relational expression corrector 125 corrects the relational expression by writing the calculated relational expression in the relational expression data 131.

The post-deterioration performance estimating apparatus 100a can thus correctly estimate the post-deterioration capacity by correcting the relational expression to improve accuracy of the relational expression.

MODIFICATION EXAMPLE 2

The modification example 2 of the embodiment of the present invention will be described next. The post-deterioration performance estimating apparatus 100 according to the above embodiment includes the relational expression acquiring unit 110, the post-deterioration performance estimator 120, and the storage unit 130. The post-deterioration performance estimator 120 includes the data acquiring unit 121, the resistance value calculator 122, the capacity ratio calculator 123, and the post-deterioration performance calculator 124. A post-deterioration performance estimating apparatus according to the present modification example is provided with at least the relational expression acquiring unit and the post-deterioration performance estimator.

Figure 15:
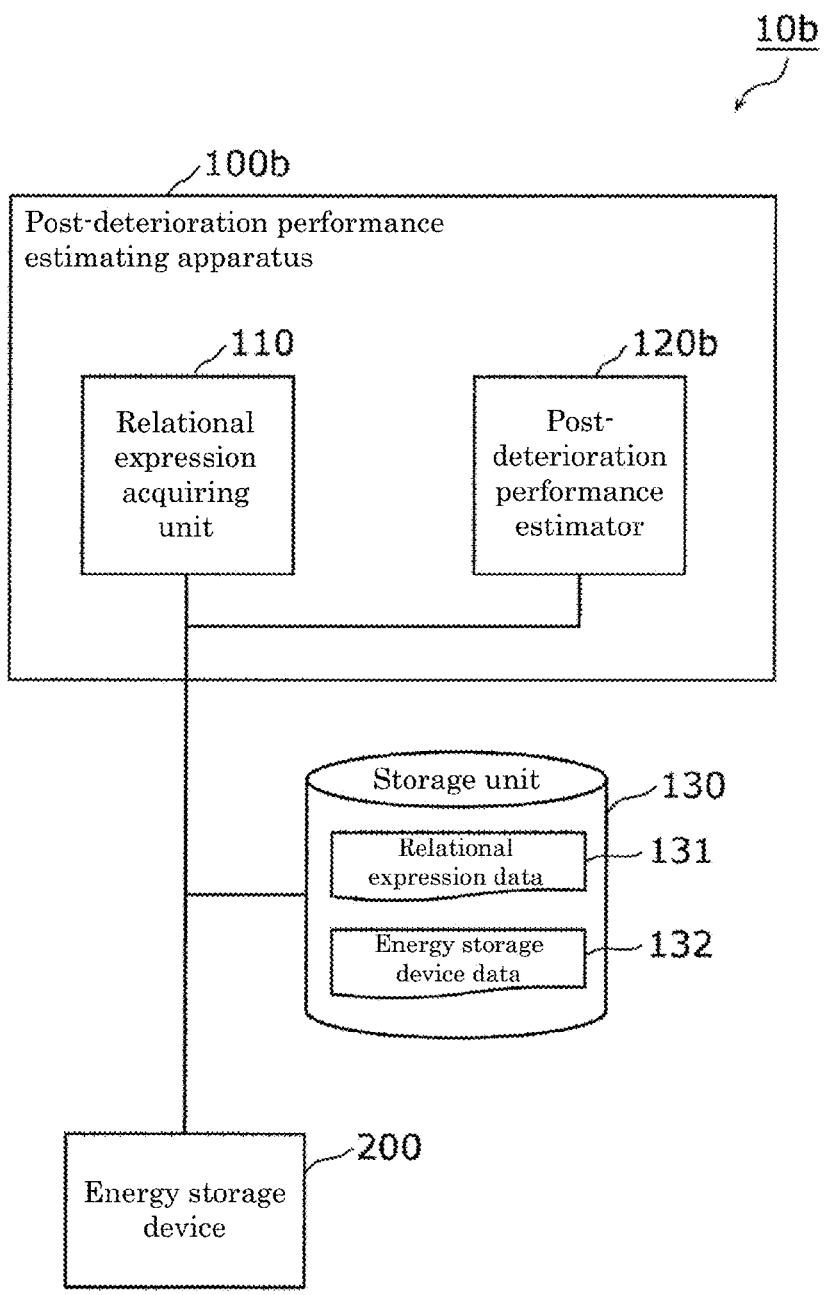
FIG. 15 is a block diagram depicting a configuration of a post-deterioration performance estimating apparatus according to a modification example 2 of the embodiment of the present invention.
Figure 16A:
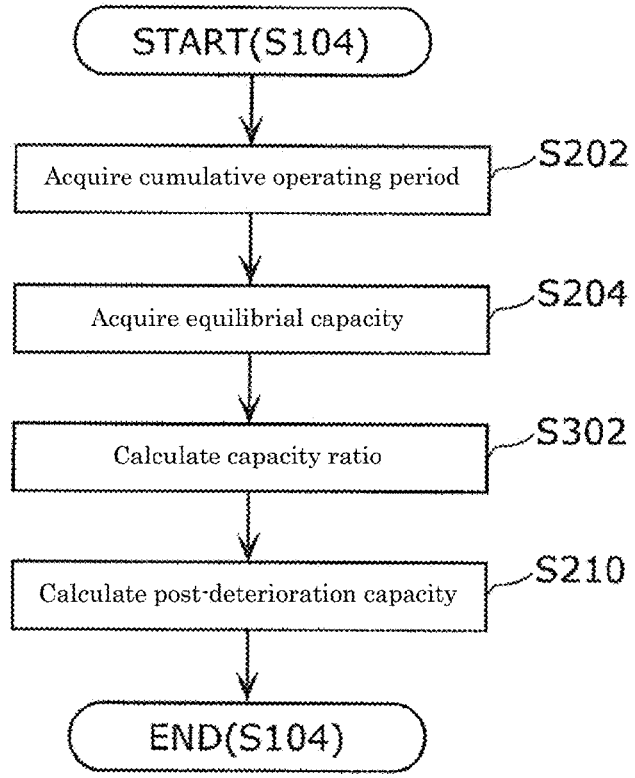
FIG. 16A is a flowchart of exemplary processes of estimating post-deterioration capacity of an energy storage device with the post-deterioration performance estimating apparatus according to the modification example 2 of the embodiment of the present invention.
Figure 16B:
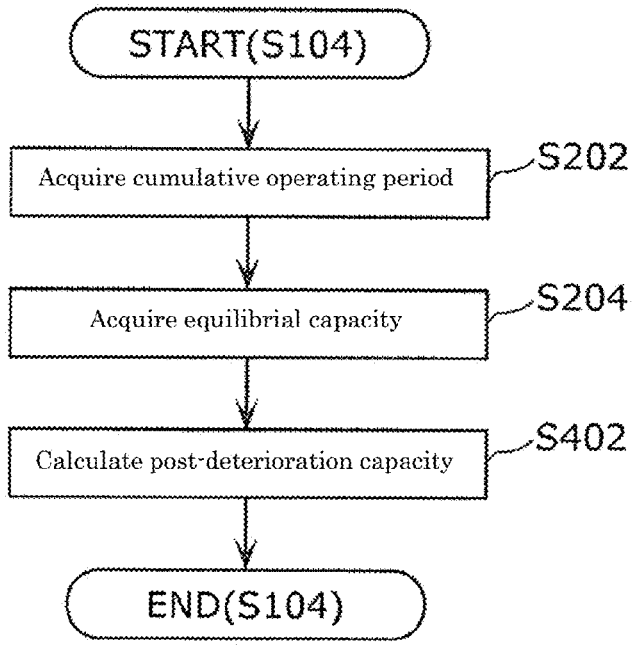
FIG. 16B is a flowchart of exemplary processes of estimating post-deterioration capacity of an energy storage device with the post-deterioration performance estimating apparatus according to the modification example 2 of the embodiment of the present invention.

FIG. 15 is a block diagram depicting a configuration of the post-deterioration performance estimating apparatus according to the modification example 2 of the embodiment of the present invention. FIGS. 16A and 16B are flowcharts of exemplary processes of estimating post-deterioration capacity of an energy storage device with the post-deterioration performance estimating apparatus according to the modification example 2 of the embodiment of the present invention.

As depicted in FIG. 15, a post-deterioration performance estimating apparatus 100b provided in an energy storage system 10b includes a relational expression acquiring unit 110 having functions similar to that according to the above embodiment and a post-deterioration performance estimator 120b, and exchanges information with an external storage unit 130 to estimate the post-deterioration capacity. The post-deterioration performance estimator 120b has only to estimate the post-deterioration capacity in accordance with the relational expression acquired by the relational expression acquiring unit 110, and is not limited to include the data acquiring unit 121, the resistance value calculator 122, the capacity ratio calculator 123, and the post-deterioration performance calculator 124 as in the above embodiment.

As exemplified in FIG. 16A, the post-deterioration performance estimator 120b calculates the capacity ratio from the cumulative operating period without executing the process (S206) of calculating the resistance value as depicted in FIG. 10 (S302). Specifically, the post-deterioration performance estimator 120b calculates the capacity ratio $r_g$ from the cumulative operating period t in accordance with the following relational expression obtained from Equations 2 and 3.

$$r_g = a \times R + b = a \times \exp(A \times t + B) + b$$

The post-deterioration performance estimator 120b does not need to include the resistance value calculator 122 as in the above embodiment.

As depicted in FIG. 16B, the post-deterioration performance estimator 120b can calculate the post-deterioration capacity from the cumulative operating period and the equilibrial capacity (S402) without executing the process of calculating the resistance value (S206) and the process of calculating the capacity ratio (S208) as depicted in FIG. 10. Specifically, the post-deterioration performance estimator 120b calculates the post-deterioration capacity Q from the cumulative operating period t and the equilibrial capacity $Q_e$ in accordance with the following relational expression obtained from Equations 2, 3, and 4.

$$Q = (1 - r_g) \times (Q_0 - Q_t)$$
$$= (1 - a \times R - b) \times (Q_0 - Q_t)$$
$$= (1 - a \times \exp(A \times t + B) - b) \times Q_e$$

The post-deterioration performance estimator 120b does not need to include the resistance value calculator 122 and the capacity ratio calculator 123 as in the above embodiment.

The post-deterioration performance estimating apparatuses 100, 100a, and 100b according to the above embodiment and the modification examples each include the relational expression acquiring unit 110. The post-deterioration performance estimator 100, 100a, or 100b does not need to include the relational expression acquiring unit 110. The post-deterioration performance estimating apparatus 100, 100a, or 100b can alternatively include the post-deterioration performance estimator 120, 120a, or 120b incorporating the necessary relational expressions such as the first relational expression by means of a program, a circuit configuration, or the like, to estimate the post-deterioration capacity without acquiring the relational expression.

MODIFICATION EXAMPLE 3

The modification example 3 of the embodiment of the present invention will be described next. The post-deterioration performance estimating apparatus 100 according to the above embodiment estimates the post-deterioration capacity assuming that the energy storage device 200 operates at substantially constant temperature not more than 60° C. The operating temperature of the energy storage device 200 is not always constant. A post-deterioration performance estimating apparatus according to the present modification example estimates post-deterioration capacity corresponding to the operating temperature of the energy storage device 200.

The fact that the operating temperature of the energy storage device 200 influences the temporal changes of the capacity of the energy storage device 200 (the energy storage capacity Q, the equilibrial capacity $Q_e$, the capacity decreased amount $Q_d$, the equilibrial capacity decreased amount $Q_f$, or the kinetic capacity decreased amount $Q_k$) and the resistance value (the resistance value of the 1 kHz alternating current resistance or the resistance value of the direct current resistance at the 30th second) will be described initially.

The operating temperature of the energy storage device 200 corresponds to temperature of an environment of the operating energy storage device 200. The operating temperature of the energy storage device 200 can be determined in accordance with internal temperature of the energy storage device 200 or in accordance with the environment (temperature) of the operating energy storage device 200.

In a case where the temperature in the environment of the operating energy storage device 200 varies, the temperature average value from the operation start point to the predetermined deterioration point of the energy storage device 200 can be set as the operating temperature of the energy storage device 200. Temperature slightly higher than the average value can be set as the operating temperature of the energy storage device 200 or maximum temperature in the environment of the operating energy storage device 200 can be set as the operating temperature of the energy storage device 200 for a safety reason.

FIGS. 17A to 18C are graphs of relation between the capacity and the cycle number (the cumulative operating period) in the case of varying the operating temperature of the energy storage device 200 according to the modification example 3 of the embodiment of the present invention.

Figure 17A:
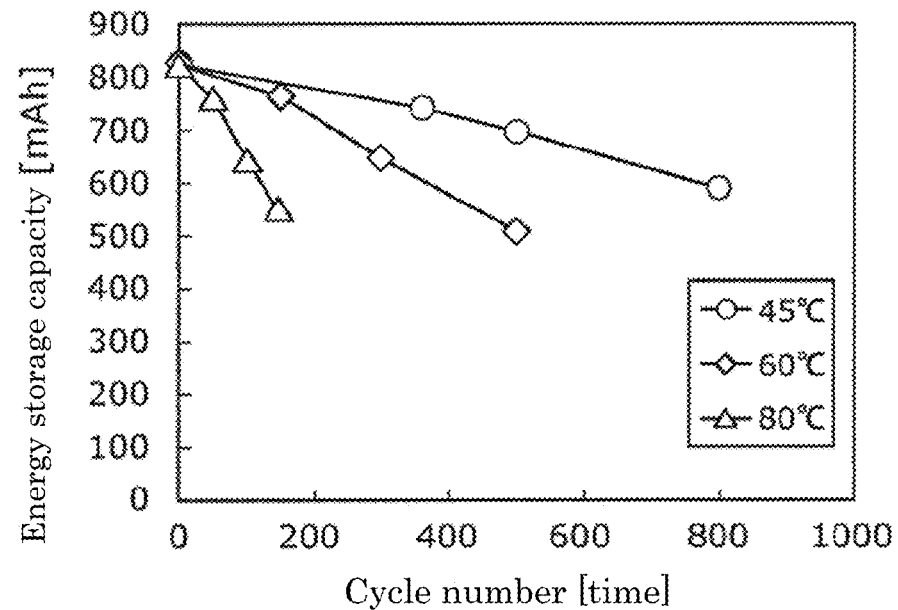
FIG. 17A is a graph of relation between energy storage capacity and a cycle number in a case of varying operating temperature of an energy storage device according to a modification example 3 of the embodiment of the present invention.

Specifically, FIG. 17A is a graph of relation between the energy storage capacity Q and the cycle number (the cumulative operating period t) in the case of varying the operating temperature of the energy storage device 200.

Figure 17B:
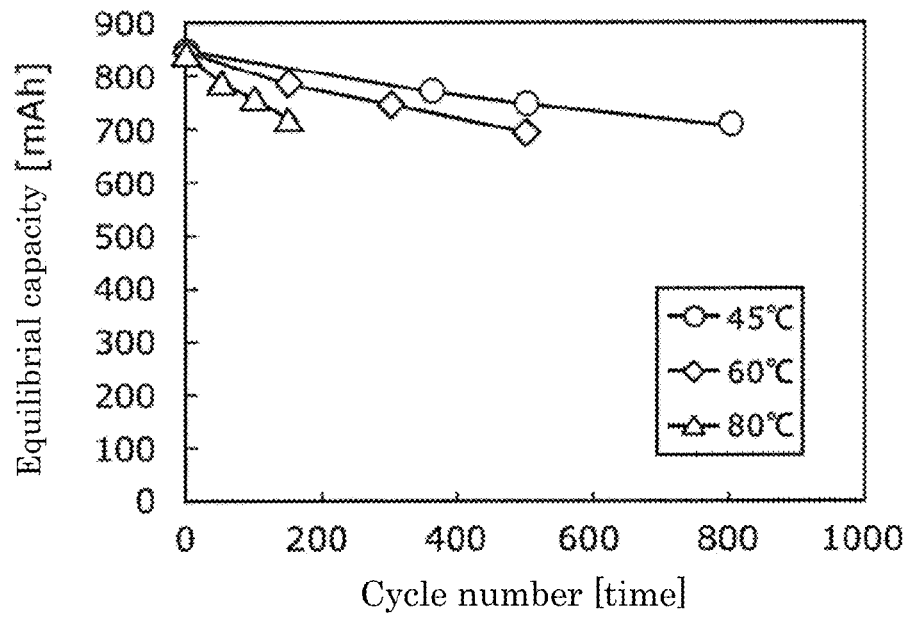
FIG. 17B is a graph of relation between equilibrial capacity and the cycle number in the case of varying the operating temperature of the energy storage device according to the modification example 3 of the embodiment of the present invention.

FIG. 17B is a graph of relation between the equilibrial capacity $Q_e$ and the cycle number (the cumulative operating period t) in the case of varying the operating temperature of the energy storage device 200.

Figure 18A:
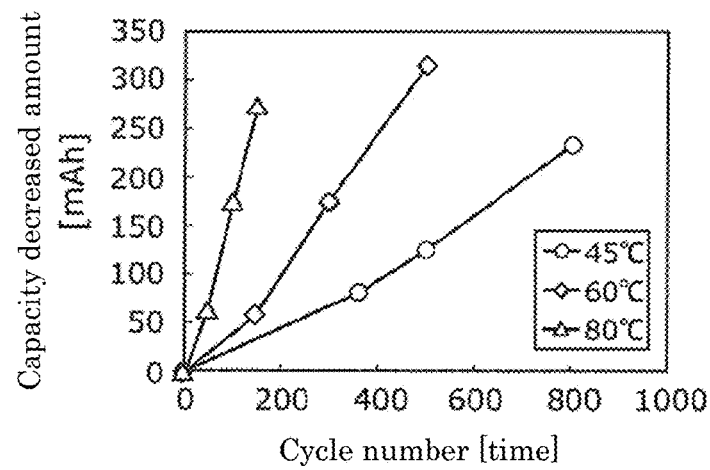
FIG. 18A is a graph of relation between a capacity decreased amount and the cycle number in the case of varying the operating temperature of the energy storage device according to the modification example 3 of the embodiment of the present invention.
Figure 18B:
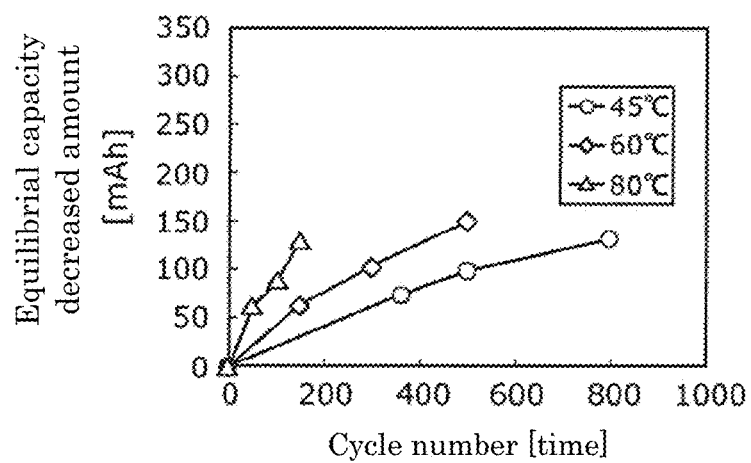
FIG. 18B is a graph of relation between an equilibrial capacity decreased amount and the cycle number in the case of varying the operating temperature of the energy storage device according to the modification example 3 of the embodiment of the present invention.
Figure 18C:
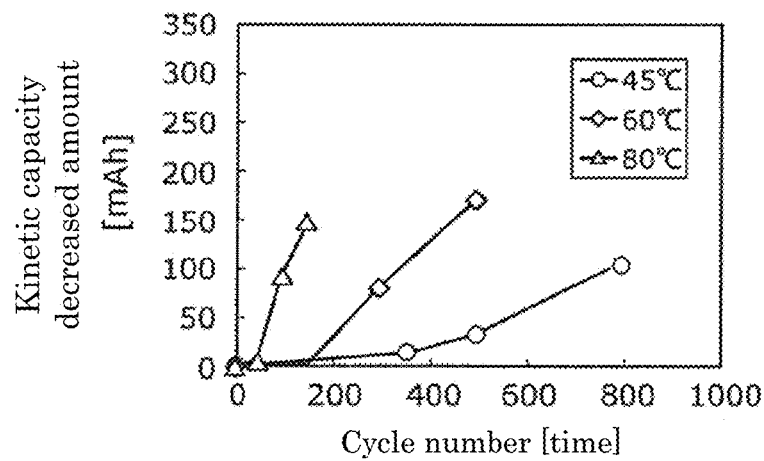
FIG. 18C is a graph of relation between a kinetic capacity decreased amount and the cycle number in the case of varying the operating temperature of the energy storage device according to the modification example 3 of the embodiment of the present invention.

FIG. 18A is a graph of relation between the capacity decreased amount $Q_d$ and the cycle number (the cumulative operating period t) in the case of varying the operating temperature of the energy storage device 200. FIG. 18B is a graph of relation between the equilibrial capacity decreased amount $Q_t$ and the cycle number (the cumulative operating period t) in the case of varying the operating temperature of the energy storage device 200. FIG. 18C is a graph of relation between the kinetic capacity decreased amount $Q_k$ and the cycle number (the cumulative operating period t) in the case of varying the operating temperature of the energy storage device 200.

Figure 19A:
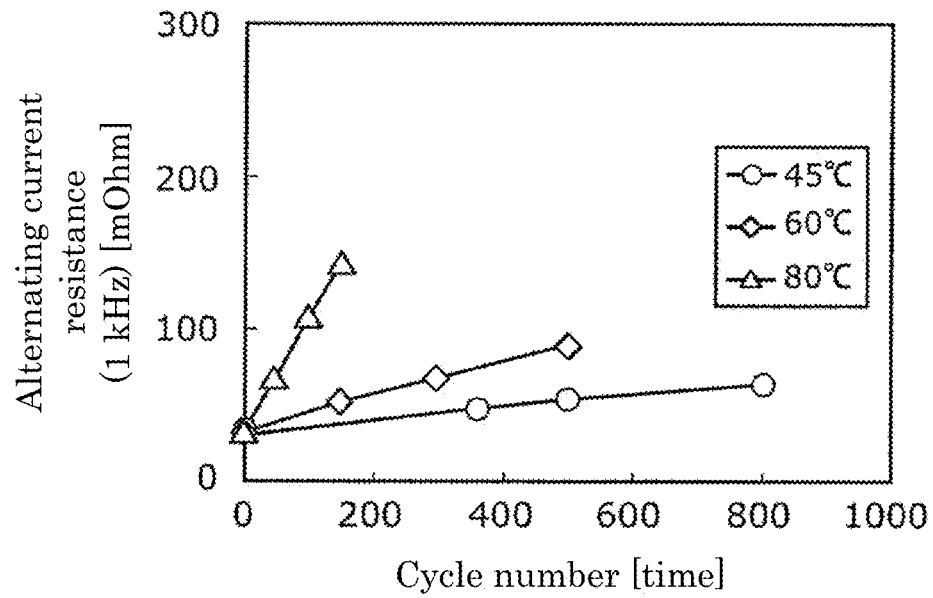
FIG. 19A is a graph of relation between a resistance value and the cycle number in the case of varying the operating temperature of the energy storage device according to the modification example 3 of the embodiment of the present invention.
Figure 19B:
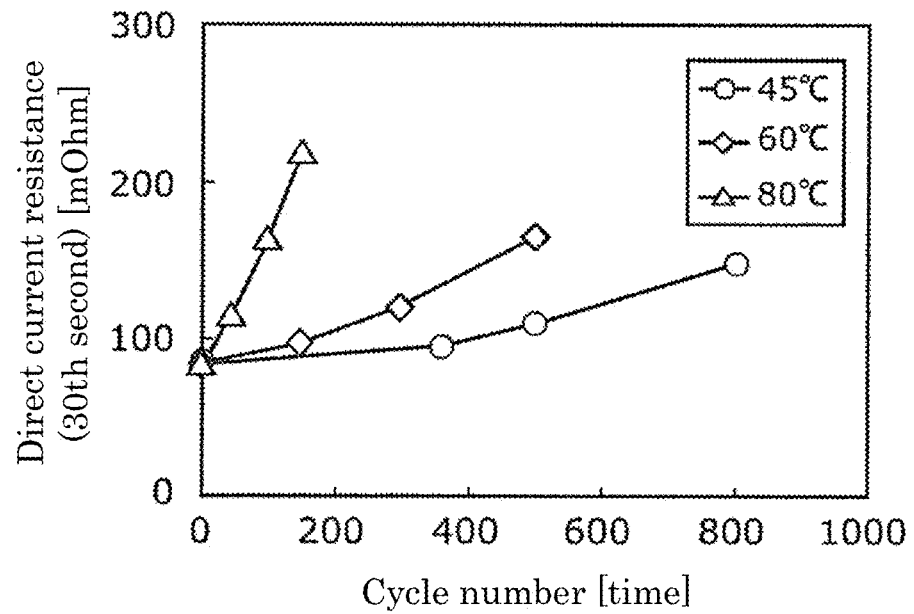
FIG. 19B is a graph of relation between a resistance value and the cycle number in the case of varying the operating temperature of the energy storage device according to the modification example 3 of the embodiment of the present invention.

FIGS. 19A and 19B are graphs of relation between the resistance value and the cycle number (the cumulative operating period) in the case of varying the operating temperature of the energy storage device 200 according to the modification example 3 of the embodiment of the present invention.

Specifically, FIG. 19A is a graph of relation between the resistance value R of the 1 kHz alternating current resistance and the cycle number (the cumulative operating period t) in the case of varying the operating temperature of the energy storage device 200. FIG. 19B is a graph of relation between the resistance value R of direct current resistance at the 30th second and the cycle number (the cumulative operating period t) in the case of varying the operating temperature of the energy storage device 200.

Similarly to the above embodiment, these graphs indicate the results of the 1 C cycle test at the SOC ranging from 0 to 100% (2.75 to 4.2 V) at the test temperature of 45° C., 60° C., and 80° C. Similarly to the above embodiment, the battery applied to this test is a lithium-ion secondary battery including a positive active material that is a mixture of layered lithium transition metal oxide expressed by Li$Ni_{1/3}Co_{1/3}Mn_{1/3}O_2$ and spinel lithium-manganese oxide.

The layered lithium transition metal oxide and the spinel lithium-manganese oxide in the positive active material are mixed at the mass ratio of 7:3 in the present modification example. A similar result will be obtained at any mixture ratio.

In the 1 C cycle test at 45° C., charge is performed by constant-current constant-voltage charge at 45° C., the current of 1 CmA (=800 mA), and the voltage of 4.2 V with charging time of three hours, whereas discharge is performed by constant-current discharge at 45° C., the current of 1 CmA (=800 mA), and the final voltage of 2.75 V. Downtime for 10 minutes is provided between charge and discharge as well as between discharge and charge. The battery is kept in the open circuit state for such downtime. One cycle accordingly includes the four steps of charge, a pause, discharge, and a pause.

Charge and discharge are similarly performed at 60° C. and 80° C. in the 1 C cycle test at 60° C. and 80° C.

In the capacity validation test on 1 CmA discharge capacity (the energy storage capacity Q), charge is performed by constant-current constant-voltage charge at 25° C., the current of 1 CmA (=800 mA), and the voltage of 4.2 V with charging time of three hours, whereas discharge is performed by constant-current discharge at 25° C., the current of 1 CmA (=800 mA), and the final voltage of 2.75 V. Downtime for 10 minutes is provided between charge and discharge as well as between discharge and charge.

In the capacity validation test on 0.05 CmA intermittent discharge capacity (the equilibrial capacity $Q_e$), charge is performed by constant-current constant-voltage charge at 25° C., the current of 0.05 CmA (=800 mA), and the voltage of 4.2 V with charging time of one hour for 30 times, whereas discharge is performed by constant-current discharge at 25° C., the current of 0.05 CmA (=800 mA), and the final voltage of 2.75 V with discharging time of one hour for 30 times. Downtime for 10 minutes is provided between charge and discharge as well as between discharge and charge.

The resistance value R of the 1 kHz alternating current resistance is measured at the frequency of 1 kHz, the SOC of 0%, and 25° C. The resistance value R of the direct current resistance at the 30th second is measured by energizing at the SOC of 50%, 25° C., and the current rates of 0.2, 0.5, and 1.0 CmA for 30 seconds upon each of charging and discharging.

As indicated in FIGS. 17A and 17B, the energy storage capacity Q and the equilibrial capacity $Q_e$ have different tendencies depending on the operating temperature of the energy storage device 200.

As indicated in FIGS. 18A to 18C, the capacity decreased amount $Q_d$, the equilibrial capacity decreased amount $Q_t$, and the kinetic capacity decreased amount $Q_k$ also have different tendencies depending on the operating temperature of the energy storage device 200. The capacity decreased amount $Q_d$, the equilibrial capacity decreased amount $Q_t$, and the kinetic capacity decreased amount $Q_k$ are calculated in accordance with $Q_d$=the initial capacity $Q_0$-Q, $Q_t=Q_0-Q_e$, and $Q_k=Q_d-Q_t$, respectively.

As indicated in FIGS. 19A and 19B, the resistance values R of both alternating current resistance and direct current resistance have different tendencies depending on the operating temperature of the energy storage device 200.

In these manners, the operating temperature of the energy storage device 200 influences the temporal changes of the capacity of the energy storage device 200 (the energy storage capacity Q, the equilibrial capacity $Q_e$, the capacity decreased amount $Q_d$, the equilibrial capacity decreased amount $Q_t$, or the kinetic capacity decreased amount $Q_k$) and the resistance value (of the 1 kHz alternating current resistance or of the direct current resistance at the 30th second).

Relation between the resistance value and the capacity ratio of the energy storage device 200 in the case of varying the operating temperature of the energy storage device 200, which is obtained from the test results indicated in FIGS. 17A to 19B will be described next.

Figure 20A:
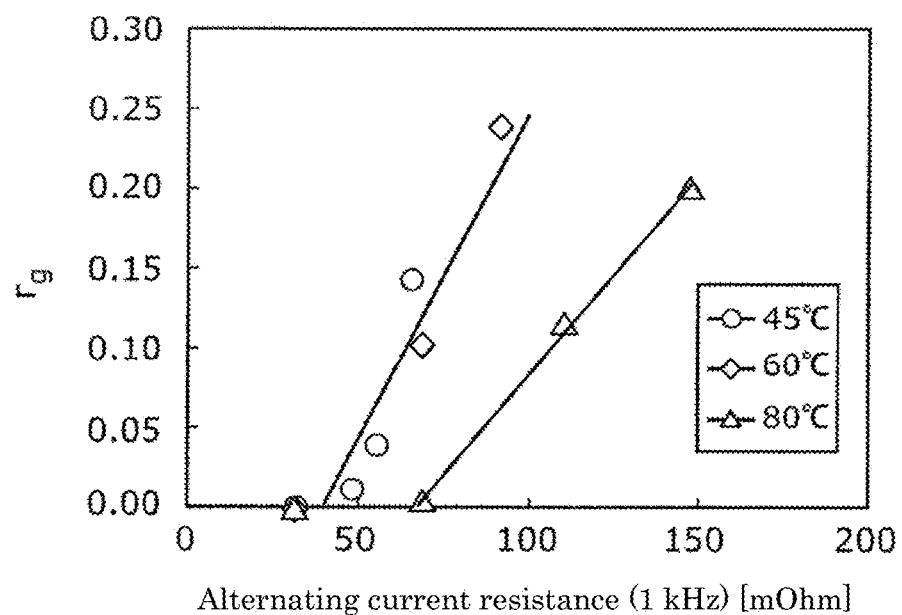
FIG. 20A is a graph of relation between a capacity ratio and the resistance value in the case of varying the operating temperature of the energy storage device according to the modification example 3 of the embodiment of the present invention.
Figure 20B:
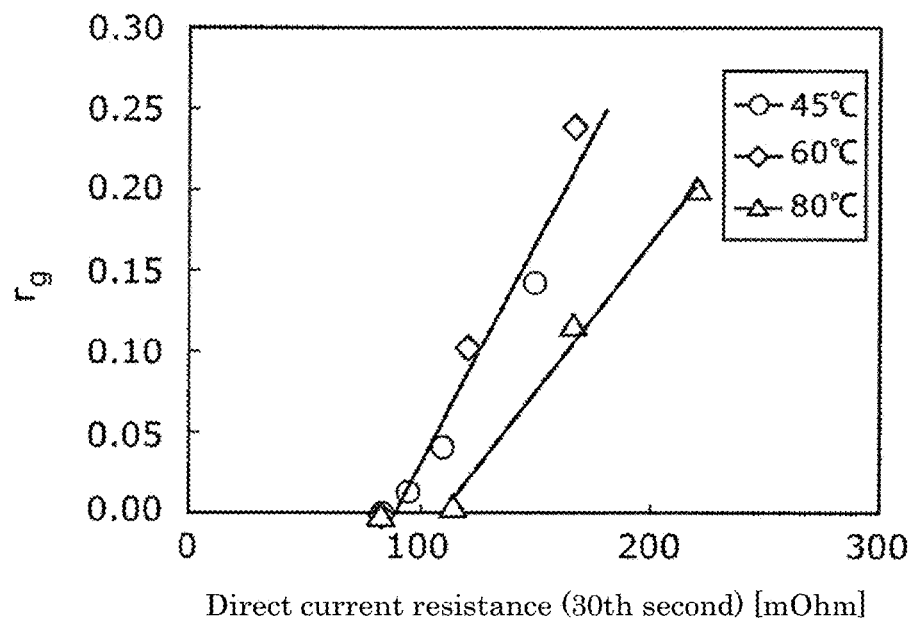
FIG. 20B is a graph of relation between the capacity ratio and the resistance value in the case of varying the operating temperature of the energy storage device according to the modification example 3 of the embodiment of the present invention.

FIGS. 20A and 20B are graphs of relation between the capacity ratio and the resistance value in the case of varying the operating temperature of the energy storage device 200 according to the modification example 3 of the embodiment of the present invention. Specifically, FIG. 20A is a graph of relation between the capacity ratio $r_g$ and the resistance value R of the 1 kHz alternating current resistance, whereas FIG. 20B is a graph of relation between the capacity ratio $r_g$ and the resistance value R of the direct current resistance at the 30th second.

As indicated in these figures, the capacity ratio $r_g$ and the resistance value R of each of alternating current resistance and direct current resistance have a linear correlation but vary in relation at 60° C. In the second relational expression $r_g=a \times R+b$ provided as Equation 2, the coefficients a and b vary at 60° C. This suggests that a reaction element process caused by increase in resistance varies at 60° C. or so.

Relation between the resistance value and the cycle number (the cumulative operating period) of the energy storage device 200 in the case of varying the operating temperature of the energy storage device 200 will be described next.

Figure 21A:
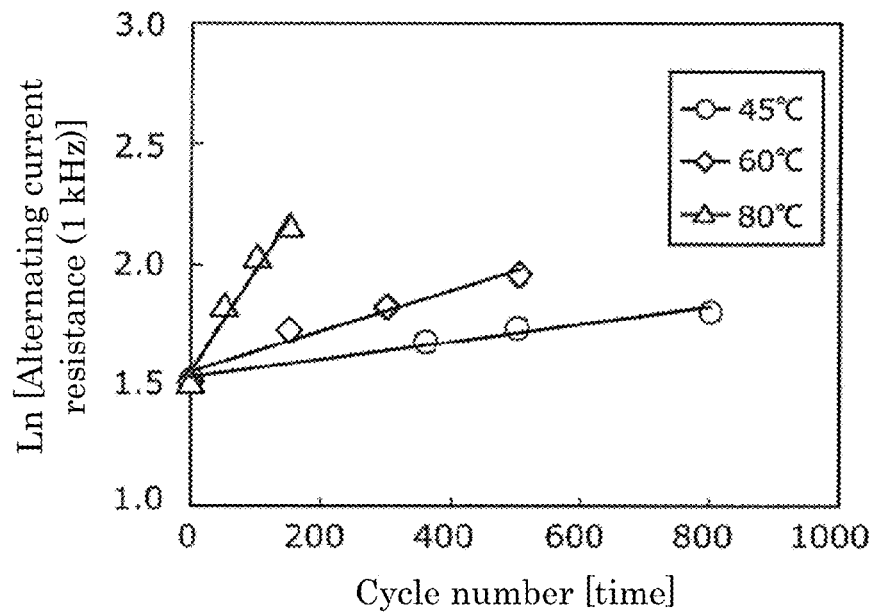
FIG. 21A is a graph of relation between the logarithm of the resistance value and the cycle number in the case of varying the operating temperature of the energy storage device according to the modification example 3 of the embodiment of the present invention.
Figure 21B:
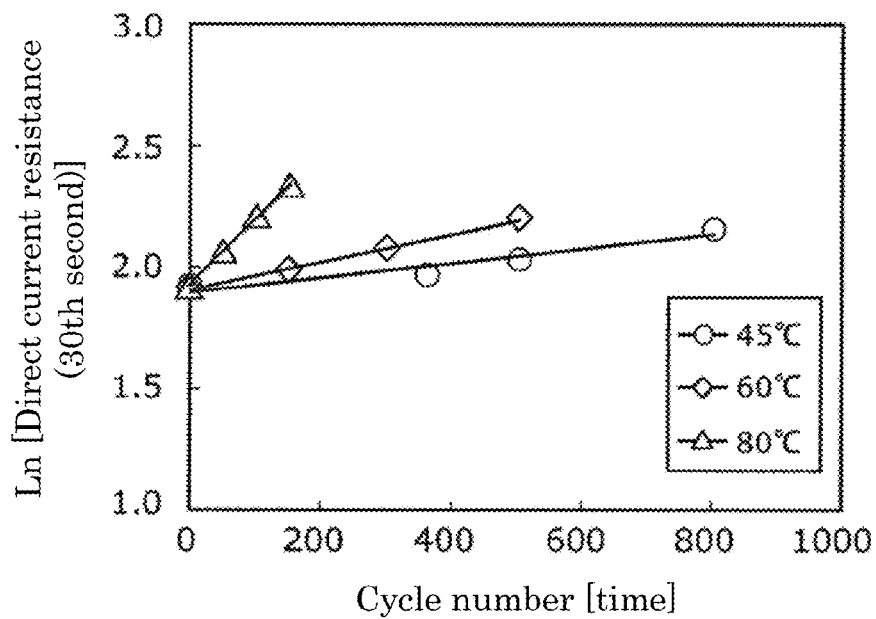
FIG. 21B is a graph of relation between the logarithm of the resistance value and the cycle number in the case of varying the operating temperature of the energy storage device according to the modification example 3 of the embodiment of the present invention.

FIGS. 21A and 21B are graphs of relation between the logarithm of the resistance value and the cycle number in the case of varying the operating temperature of the energy storage device 200 according to the modification example 3 of the embodiment of the present invention. Specifically, FIG. 21A is a graph of relation between the logarithm of the resistance value R of the 1 kHz alternating current resistance and the cycle number (the cumulative operating period t), whereas FIG. 21B is a graph of relation between the resistance value R of the direct current resistance at the 30th second and the cycle number (the cumulative operating period t).

Figure 22A:
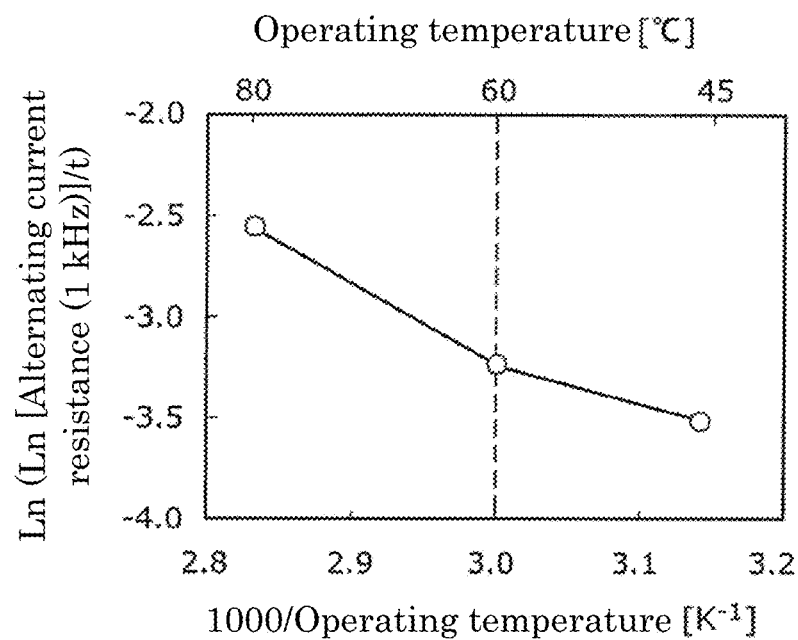
FIG. 22A is a graph of relation among the resistance value, the operating temperature, and the cycle number of the energy storage device according to the modification example 3 of the embodiment of the present invention.
Figure 22B:
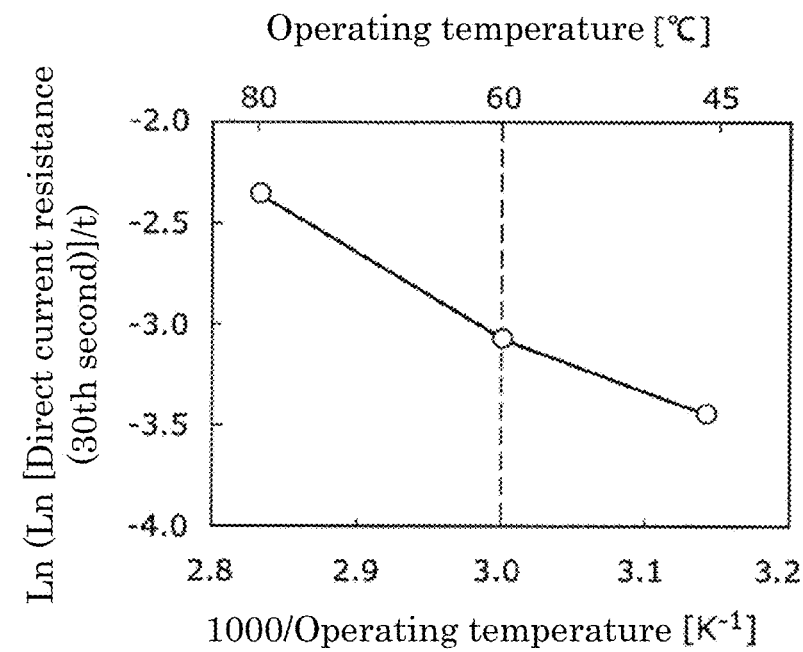
FIG. 22B is a graph of relation among the resistance value, the operating temperature, and the cycle number of the energy storage device according to the modification example 3 of the embodiment of the present invention.

FIGS. 22A and 22B are graphs of relation among the resistance value, the operating temperature, and the cycle number of the energy storage device 200 according to the modification example 3 of the embodiment of the present invention. Specifically, FIG. 22A is a graph of relation between the logarithm of a value obtained by dividing the logarithm of the resistance value R of the 1 kHz alternating current resistance by the cycle number (the cumulative operating period t) and the reciprocal of the operating temperature of the energy storage device 200. FIG. 22B is a graph of relation between the logarithm of a value obtained by dividing the logarithm of the resistance value R of the direct current resistance at the 30th second by the cycle number (the cumulative operating period t) and the reciprocal of the operating temperature of the energy storage device 200.

As indicated in FIGS. 21A and 21B, the logarithm of the resistance value R of each of alternating current resistance and direct current resistance and the cycle number (the cumulative operating period t) have a linear correlation but have different relation depending on the operating temperature of the energy storage device 200.

As indicated also in FIGS. 22A and 22B, the relation between the logarithm of the value obtained by dividing the logarithm of the resistance value R of each of alternating current resistance and direct current resistance by the cumulative operating period t and the reciprocal of the operating temperature of the energy storage device 200 has a linear line varying at 60° C.

The resistance value R can be expressed by Equation 5 including the cumulative operating period t and operating temperature T (° C.) of the energy storage device 200.

$$R=\exp(\exp[D \times \{1/(273.15+T)\}+E] \times t+F) \qquad \text{(Equation 5)}$$

In this equation, coefficients D, E, and F are constants and vary at 60° C. as the operating temperature T of the energy storage device 200. The coefficients D, E, and F also vary depending on whether the resistance value R relates to alternating current resistance or direct current resistance.

Equation 5 on the resistance value R expressed by the cumulative operating period t and the operating temperature T corresponds to the third relational expression acquired by the relational expression acquiring unit 110. Established in the third relational expression $R=\exp(A \times t+B)$ provided as Equation 3 are $A=\exp[D \times \{1/(273.15+T)\}+E]$ and $B=F$. The third relational expression thus has, as a coefficient, an exponential function according to an Arrhenius equation having, as a variable, the reciprocal of temperature for temperature correction.

Relation between the equilibrial capacity decreased amount and the cycle number (the cumulative operating period) in the case of varying the operating temperature of the energy storage device 200 will be described next.

Figure 23A:
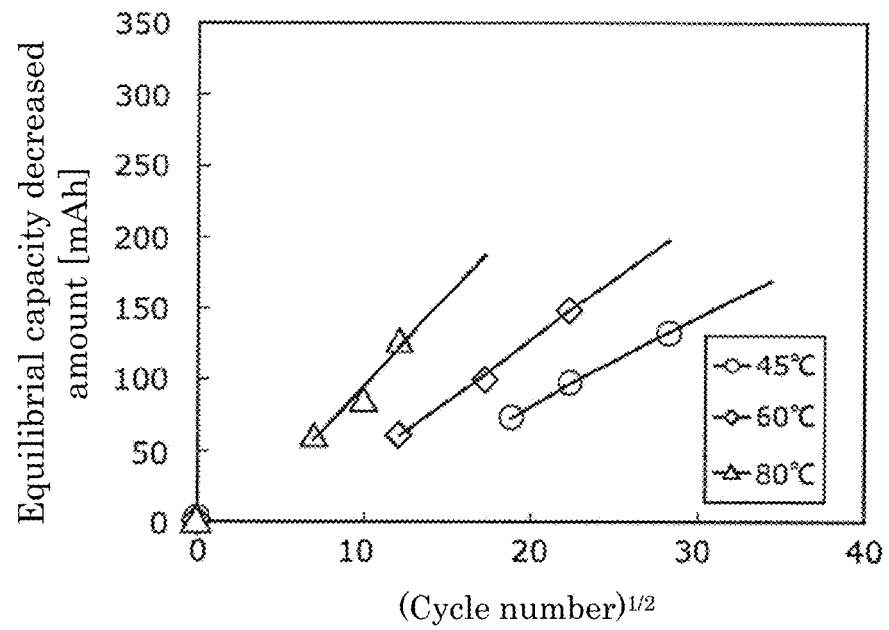
FIG. 23A is a graph of relation between the equilibrial capacity decreased amount and a cycle number in the case of varying the operating temperature of the energy storage device according to the modification example 3 of the embodiment of the present invention.

FIG. 23A is a graph of relation between the equilibrial capacity decreased amount and the cycle number in the case of varying the operating temperature of the energy storage device 200 according to the modification example 3 of the embodiment of the present invention. Specifically, FIG. 23A is a graph of relation between the equilibrial capacity decreased amount $Q_t$ and the square root of the cycle number (the cumulative operating period t).

Figure 23B:
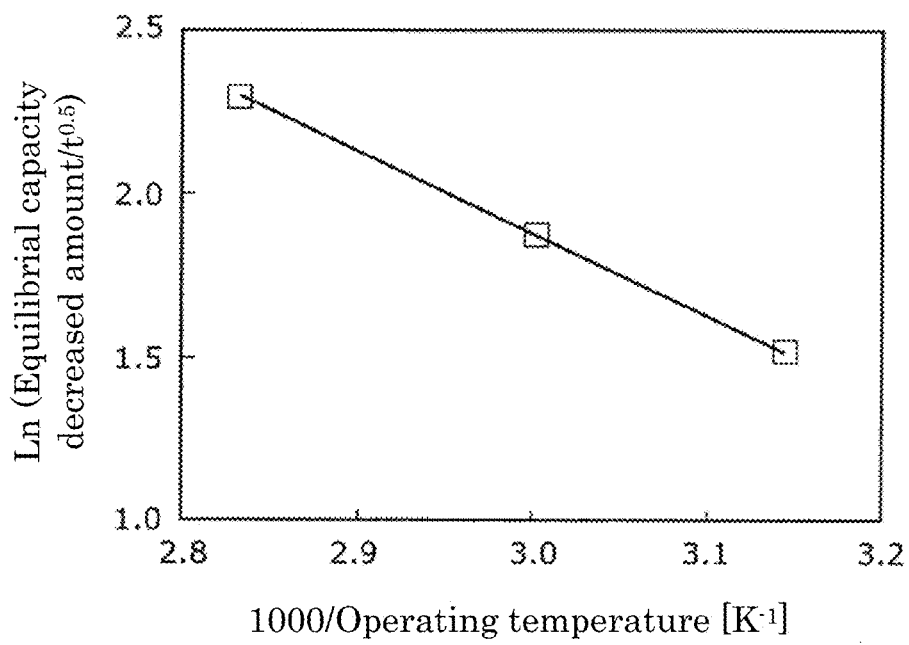
FIG. 23B is a graph of relation among the equilibrial capacity decreased amount, the operating temperature, and the cycle number of the energy storage device according to the modification example 3 of the embodiment of the present invention.

FIG. 23B is a graph of relation among the equilibrial capacity decreased amount, the operating temperature, and the cycle number of the energy storage device 200 according to the modification example 3 of the embodiment of the present invention. Specifically, FIG. 23B is a graph of relation between the logarithm of a value obtained by dividing the equilibrial capacity decreased amount $Q_t$ by the square root of the cycle number (the cumulative operating period t) and the reciprocal of the operating temperature of the energy storage device 200.

As indicated in FIG. 23A, the equilibrial capacity decreased amount $Q_t$ and the square root of the cycle number (the cumulative operating period t) have a linear correlation except at the initial life stage, but vary in relation depending on the operating temperature of the energy storage device 200.

As indicated in FIG. 23B, the logarithm of the value obtained by dividing the equilibrial capacity decreased amount $Q_t$ by the square root of the cycle number (the cumulative operating period t) and the reciprocal of the operating temperature of the energy storage device 200 have a linear correlation.

The equilibrial capacity decreased amount $Q_t$ can be thus expressed by Equation 6 on the cumulative operating period t and operating temperature T (° C.) of the energy storage device 200.

$$Q_t=\exp[G \times \{1/(273.15+T)\}+H] \times t^{0.5}+J \qquad \text{(Equation 6)}$$

In this equation, coefficients G, H, and J are constants. The relational expression provided as Equation 6 is called a fifth relational expression. The fifth relational expression has, as a coefficient, an exponential function according to an Arrhenius equation having, as a variable, the reciprocal of temperature for temperature correction. The first relational expression obtained from the fifth relational expression is applied to calculate the post-deterioration capacity.

The post-deterioration performance estimating apparatus configured to estimate post-deterioration capacity in accordance with the above relational expression will be described next.

Figure 24:
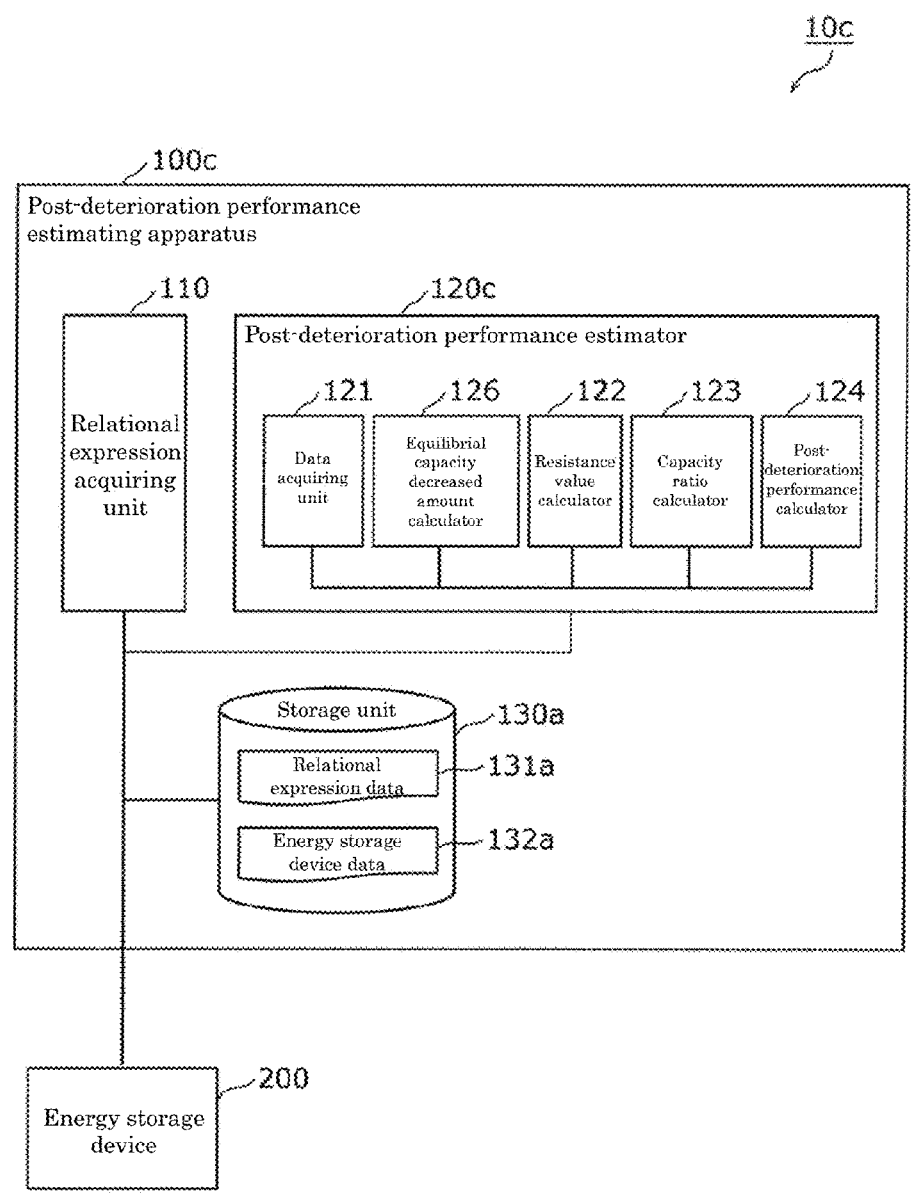
FIG. 24 is a block diagram depicting a configuration of a post-deterioration performance estimating apparatus according to the modification example 3 of the embodiment of the present invention.
Figures 25, 26:
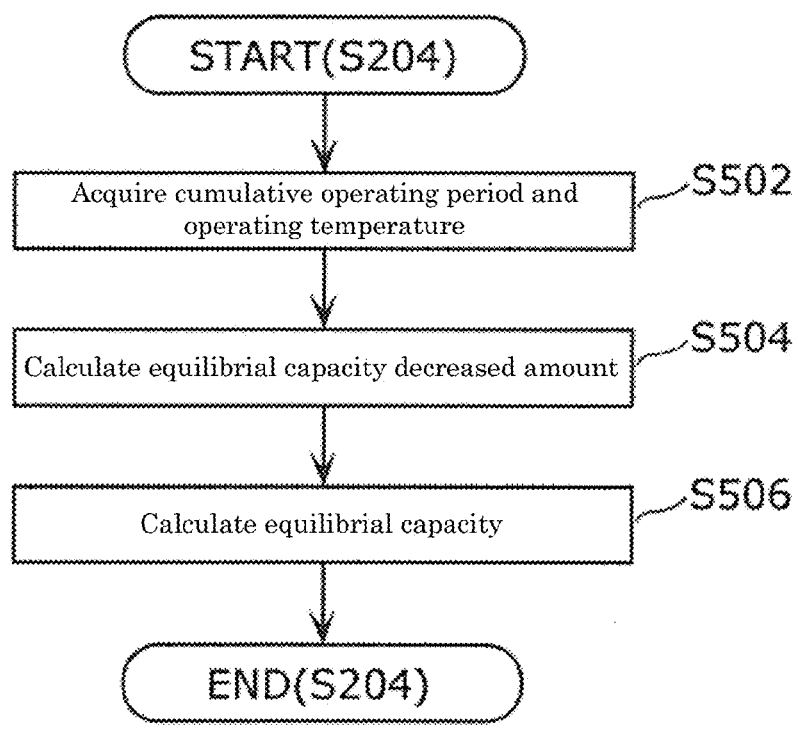
FIG. 25 is a chart exemplifying energy storage device data according to the modification example 3 of the embodiment of the present invention.
FIG. 26 is a flowchart of exemplary processes of acquiring equilibrial capacity with a data acquiring unit according to the modification example 3 of the embodiment of the present invention.

FIG. 24 is a block diagram depicting a configuration of a post-deterioration performance estimating apparatus 100c according to the modification example 3 of the embodiment of the present invention. FIG. 25 is a chart exemplifying energy storage device data 132a according to the modification example 3 of the embodiment of the present invention.

As depicted in FIG. 24, the post-deterioration performance estimating apparatus 100c provided in an energy storage system 10c includes a post-deterioration performance estimator 120c equipped with an equilibrial capacity decreased amount calculator 126 configured to calculate an equilibrial capacity decreased amount. The post-deterioration performance estimator 120c estimates the post-deterioration capacity in accordance with the equilibrial capacity decreased amount calculated by the equilibrial capacity decreased amount calculator 126.

In other words, the post-deterioration performance estimating apparatus 100c includes the post-deterioration performance estimator 120c in place of the post-deterioration performance estimator 120 in the post-deterioration performance estimating apparatus 100 according to the above embodiment. The post-deterioration performance estimator 120c includes the equilibrial capacity decreased amount calculator 126 in addition to the constituent elements in the post-deterioration performance estimator 120.

The post-deterioration performance estimating apparatus 100c includes a storage unit 130a in place of the storage unit 130 in the post-deterioration performance estimating apparatus 100 according to the above embodiment.

The storage unit 130a stores relational expression data 131a and the energy storage device data 132a in place of the relational expression data 131 and the energy storage device data 132 according to the above embodiment.

The relational expression data 131a includes first relational expressions each including the corresponding second, third, and fifth relational expressions for estimation of post-deterioration capacity of the energy storage device 200. The relational expression data 131a preliminarily stores the second relational expression for calculation of the capacity ratio $r_g$, the third relational expression for calculation of the resistance value R, and the fifth relational expression for calculation of the equilibrial capacity decreased amount $Q_r$.

As indicated in FIG. 25, the energy storage device data 132a contains sets of data on operating temperature of the energy storage device 200 in addition to the data stored in the energy storage device data 132 according to the above embodiment. The operating temperature of the energy storage device 200 is stored in the energy storage device data 132a in correspondence with the cumulative operating periods. The operating temperature of the energy storage device 200 is written in the energy storage device data 132a for each cumulative operating period by the data acquiring unit 121.

Specifically, the data acquiring unit 121 acquires the operating temperature of the energy storage device 200 by measuring the internal temperature of the energy storage device 200 or acquiring, from a user, information on the environment (temperature) of the operating energy storage device 200 to acquire the operating temperature of the energy storage device 200.

In a case where the temperature in the environment of the operating energy storage device 200 varies, the data acquiring unit 121 acquires the temperature average value from the operation start point to the predetermined deterioration point of the energy storage device 200, for example, as the operating temperature of the energy storage device 200. Alternatively, the data acquiring unit 121 can acquire temperature slightly higher than the average value or the maximum operating temperature of the energy storage device 200 as the operating temperature of the energy storage device 200 for a safety reason.

The data acquiring unit 121 then writes the acquired operating temperature of the energy storage device 200 in the energy storage device data 132a.

The relational expression acquiring unit 110 acquires the first relational expression including the second, third, and fifth relational expressions from the relational expression data 131a.

The equilibrial capacity decreased amount calculator 126 acquires the cumulative operating period and the operating temperature from the energy storage device data 132a and calculates the equilibrial capacity decreased amount in accordance with the fifth relational expression acquired by the relational expression acquiring unit 110.

The data acquiring unit 121 acquires the equilibrial capacity decreased amount calculated by the equilibrial capacity decreased amount calculator 126, calculates the equilibrial capacity, and writes the calculated equilibrial capacity in the energy storage device data 132a. Alternatively, the equilibrial capacity decreased amount calculated by the equilibrial capacity decreased amount calculator 126 can be written and stored in the energy storage device data 132a in place of the equilibrial capacity.

The resistance value calculator 122 acquires the cumulative operating period and the operating temperature from the energy storage device data 132a and calculates the resistance value in accordance with the third relational expression acquired by the relational expression acquiring unit 110. The resistance value calculator 122 then writes the calculated resistance value in the energy storage device data 132a.

The capacity ratio calculator 123 acquires the operating temperature and the resistance value from the energy storage device data 132a and calculates the capacity ratio in accordance with the second relational expression acquired by the relational expression acquiring unit 110. The capacity ratio calculator 123 then writes the calculated capacity ratio in the energy storage device data 132a.

The post-deterioration performance calculator 124 acquires the equilibrial capacity and the capacity ratio from the energy storage device data 132a and calculates the post-deterioration capacity.

Detailed functions of the respective constituent elements in the post-deterioration performance estimating apparatus 100c are similar to the functions of the constituent elements in the post-deterioration performance estimating apparatus 100 according to the above embodiment, and will not be described in detail.

Processes of estimating the post-deterioration capacity of the energy storage device 200 with the post-deterioration performance estimating apparatus 100c will be described next. The rough flow of the process of acquiring the relational expression with the relational expression acquiring unit 110 (S102 in FIG. 9) and the process of estimating the post-deterioration capacity with the post-deterioration performance estimator 120 (S104 in FIG. 9, and FIG. 10) is similar to the flow in FIGS. 9 and 10, and will not be described repeatedly.

The process of acquiring the equilibrial capacity with the data acquiring unit 121 (S204 in FIG. 10), the process of calculating the resistance value with the resistance value calculator 122 (S206 in FIG. 10), and the process of calculating the capacity ratio with the capacity ratio calculator 123 (S208 in FIG. 10) will be described in detail below.

The process of acquiring the equilibrial capacity with the data acquiring unit 121 (S204 in FIG. 10) will be described initially. FIG. 26 is a flowchart of exemplary processes of acquiring the equilibrial capacity with the data acquiring unit 121 according to the modification example 3 of the embodiment of the present invention.

As depicted in this figure, the equilibrial capacity decreased amount calculator 126 acquires the cumulative operating period and the operating temperature of the energy storage device 200 at the deterioration point with reference to the energy storage device data 132a (S502).

The equilibrial capacity decreased amount calculator 126 then calculates the equilibrial capacity decreased amount of the energy storage device 200 at the deterioration point in accordance with the fifth relational expression acquired by the relational expression acquiring unit 110. Specifically, the equilibrial capacity decreased amount calculator 126 calculates the equilibrial capacity decreased amount $Q_t$ by substituting the cumulative operating period t and the operating temperature T in the fifth relational expression provided as Equation 6.

The data acquiring unit 121 calculates the equilibrial capacity of the energy storage device 200 at the deterioration point from the equilibrial capacity decreased amount calculated by the equilibrial capacity decreased amount calculator 126 (S506). Specifically, the data acquiring unit 121 calculates the equilibrial capacity $Q_e$ in accordance with $Q_e=Q_0-Q_t$. The data acquiring unit 121 then stores the calculated equilibrial capacity $Q_e$ in the energy storage device data 132a in the storage unit 130a.

The process of acquiring the equilibrial capacity with the data acquiring unit 121 (S204 in FIG. 10) thus ends.

As described above, the data acquiring unit 121 according to the above embodiment acquires the equilibrial capacity in accordance with the known method. According to the present modification example, the equilibrial capacity decreased amount calculator 126 calculates the equilibrial capacity decreased amount to acquire the equilibrial capacity.

Figure 27:
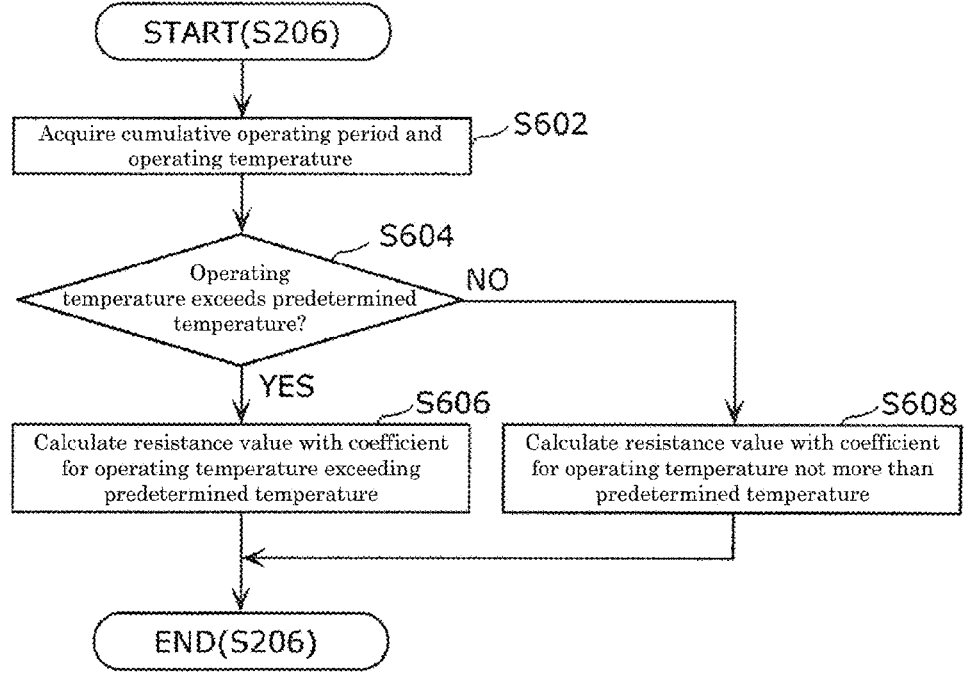
FIG. 27 is a flowchart of exemplary processes of calculating a resistance value with a resistance value calculator according to the modification example 3 of the embodiment of the present invention.

The process of calculating the resistance value with the resistance value calculator 122 (S206 in FIG. 10) will be described next. FIG. 27 is a flowchart of exemplary processes of calculating the resistance value with the resistance value calculator 122 according to the modification example 3 of the embodiment of the present invention.

As depicted in this figure, the resistance value calculator 122 acquires the cumulative operating period and the operating temperature of the energy storage device 200 at the deterioration point with reference to the energy storage device data 132a (S602).

The resistance value calculator 122 determines whether or not the acquired operating temperature of the energy storage device 200 exceeds predetermined temperature (S604). The predetermined temperature is preferably 60° C. for a lithium-ion secondary battery. The predetermined temperature is not limited to 60 but is determined appropriately in accordance with the type of the battery.

If the resistance value calculator 122 determines that the acquired operating temperature of the energy storage device 200 exceeds the predetermined temperature (YES in S604), the resistance value calculator 122 calculates the resistance value of the energy storage device 200 at the deterioration point using a coefficient for the operating temperature exceeding the predetermined temperature (S606). The resistance value calculator 122 calculates the resistance value in accordance with the third relational expression that is acquired by the relational expression acquiring unit 110 and has the coefficient for the operating temperature exceeding the predetermined temperature.

If the resistance value calculator 122 determines that the acquired operating temperature of the energy storage device 200 is not more than the predetermined temperature (NO in S604), the resistance value calculator 122 calculates the resistance value of the energy storage device 200 at the deterioration point using a coefficient for the operating temperature not more than the predetermined temperature (S608). The resistance value calculator 122 calculates the resistance value in accordance with the third relational expression that is acquired by the relational expression acquiring unit 110 and has the coefficient for the operating temperature not more than the predetermined temperature.

Specifically, the resistance value calculator 122 calculates the resistance value R by substituting the cumulative operating period t and the operating temperature T in the third relational expression that is provided as Equation 5 and has the coefficient for the operating temperature. The resistance value calculator 122 then stores the calculated resistance value R in the energy storage device data 132a.

The process of calculating the resistance value with the resistance value calculator 122 (S206 in FIG. 10) thus ends.

Figure 28:
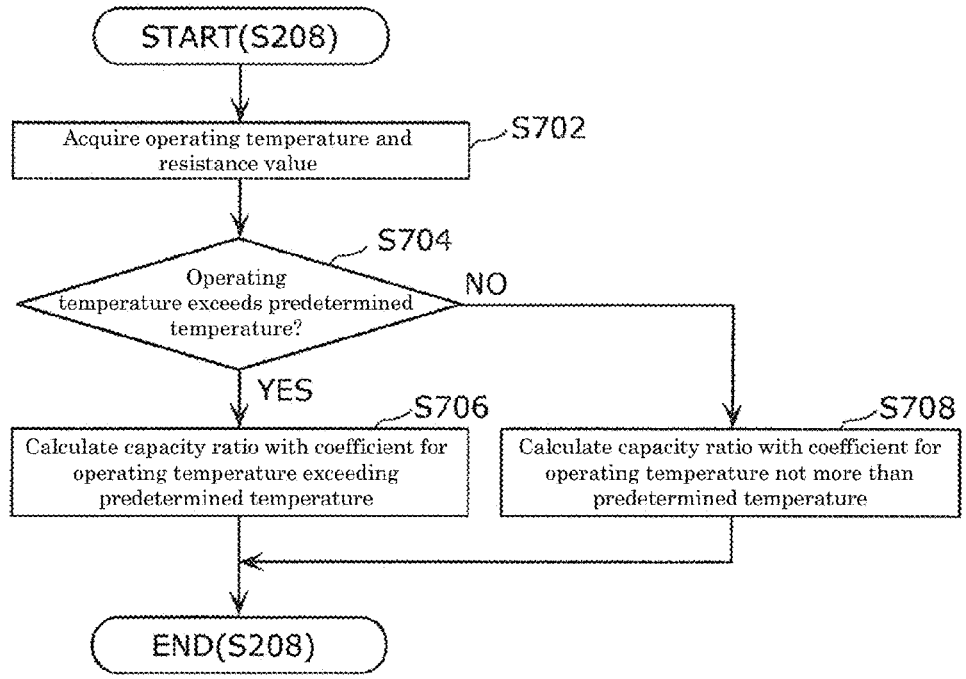
FIG. 28 is a flowchart of exemplary processes of calculating a capacity ratio with a capacity ratio calculator according to the modification example 3 of the embodiment of the present invention.

The process of calculating the capacity ratio with the capacity ratio calculator 123 (S208 in FIG. 10) will be described next. FIG. 28 is a flowchart of exemplary processes of calculating the capacity ratio with the capacity ratio calculator 123 according to the modification example 3 of the embodiment of the present invention.

As depicted in this figure, the capacity ratio calculator 123 acquires the operating temperature and the resistance value of the energy storage device 200 at the deterioration point with reference to the energy storage device data 132a (S702).

The capacity ratio calculator 123 determines whether or not the acquired operating temperature of the energy storage device 200 exceeds predetermined temperature (S704). The predetermined temperature is preferably 60° C. for a lithium-ion secondary battery. The predetermined temperature is not limited to 60° C. but is determined appropriately in accordance with the type of the battery.

If the capacity ratio calculator 123 determines that the acquired operating temperature of the energy storage device 200 exceeds the predetermined temperature (YES in S704), the capacity ratio calculator 123 calculates the capacity ratio of the energy storage device 200 at the deterioration point using a coefficient for the operating temperature exceeding the predetermined temperature (S706). The capacity ratio calculator 123 calculates the capacity ratio in accordance with the second relational expression that is acquired by the relational expression acquiring unit 110 and has the coefficient for the operating temperature exceeding the predetermined temperature.

If the capacity ratio calculator 123 determines that the acquired operating temperature of the energy storage device 200 is not more than the predetermined temperature (NO in S704), the capacity ratio calculator 123 calculates the capacity ratio of the energy storage device 200 at the deterioration point using a coefficient for the operating temperature not more than the predetermined temperature (S608). The capacity ratio calculator 123 calculates the capacity ratio in accordance with the second relational expression that is acquired by the relational expression acquiring unit 110 and has the coefficient for the operating temperature not more than the predetermined temperature.

Specifically, the capacity ratio calculator 123 calculates the capacity ratio $r_g$ by substituting the resistance value R in the second relational expression that is provided as Equation 2 and has the coefficient for the operating temperature. The capacity ratio calculator 123 then stores the calculated capacity ratio $r_g$ in the energy storage device data 132a.

The process of calculating the capacity ratio with the capacity ratio calculator 123 (S208 in FIG. 10) thus ends.

In this manner, the post-deterioration performance estimator 120c estimates the post-deterioration capacity in accordance with the first relational expression obtained from the equilibrial capacity decreased amount that includes the member of the square root of the cumulative operating period and has, as the coefficient in the member of the square root, the exponential function having the reciprocal of the operating temperature of the energy storage device 200 as the variable.

The post-deterioration performance estimator 120c estimates the post-deterioration capacity in accordance with the second relational expression that has the coefficient varying depending on whether the operating temperature of the energy storage device 200 exceeds or is not more than the predetermined temperature (e.g. 60° C.).

The post-deterioration performance estimator 120c estimates the post-deterioration capacity in accordance with the third relational expression that has the predetermined coefficient obtained by multiplying the cumulative operating period and the exponential function (A mentioned earlier) having the reciprocal of the operating temperature of the energy storage device 200 as the variable.

The post-deterioration performance estimator 120c estimates the post-deterioration capacity in accordance with the third relational expression that includes the coefficients (D and E mentioned earlier) of the exponential function having the reciprocal of the operating temperature of the energy storage device 200 as the variable, and the coefficients vary depending on whether the operating temperature of the energy storage device 200 exceeds or is not more than the predetermined temperature (e.g. 60° C.).

As described above, the post-deterioration performance estimating apparatus 100c according to the modification example 3 of the embodiment of the present invention can accurately estimate the discharge capacity of the energy storage device 200 at the predetermined deterioration point in accordance with the operating temperature of the energy storage device 200.

The inventors of the present application have found, through intensive studies and tests, that the coefficient in the second relational expression varies depending on whether or not the operating temperature of the energy storage device 200 exceeds the predetermined temperature (e.g. 60° C.). The post-deterioration performance estimating apparatus 100c can thus accurately estimate the discharge capacity of the energy storage device 200 at the predetermined deterioration point in accordance with the second relational expression having the coefficient that varies depending on the operating temperature of the energy storage device 200.

The inventors of the present application have found, through intensive studies and tests, that a temporal change of the resistance value of the energy storage device 200 can be expressed accurately if the coefficient in the exponential function of the third relational expression is the exponential function having the reciprocal of the operating temperature of the energy storage device 200 as the variable. The post-deterioration performance estimating apparatus 100c can thus accurately estimate the discharge capacity of the energy storage device 200 at the predetermined deterioration point in accordance with the third relational expression corrected in terms of temperature.

The inventors of the present application have found, through intensive studies and tests, that the coefficient in the exponential function having the reciprocal of the operating temperature of the energy storage device 200 as the variable in the third relational expression varies depending on whether or not the operating temperature of the energy storage device 200 exceeds the predetermined temperature (e.g. 60° C.). The post-deterioration performance estimating apparatus 100c can thus accurately estimate the discharge capacity of the energy storage device 200 at the predetermined deterioration point in accordance with the third relational expression having the coefficient that varies depending on the operating temperature of the energy storage device 200.

The inventors of the present application have found, through intensive studies and tests, that the equilibrial capacity decreased amount can be expressed accurately if the coefficient in the root member of the cumulative operating period for the equilibrial capacity decreased amount has the exponential function having the reciprocal of the operating temperature of the energy storage device 200 as the variable. The post-deterioration performance estimating apparatus 100c can thus accurately estimate the discharge capacity of the energy storage device 200 at the predetermined deterioration point from the equilibrial capacity decreased amount corrected in terms of temperature.

Assumed in the present modification example that temperature is corrected in each of the process of acquiring the equilibrial capacity with the data acquiring unit 121 (S204 in FIG. 10), the process of calculating the resistance value with the resistance value calculator 122 (S206 in FIG. 10), and the process of calculating the capacity ratio with the capacity ratio calculator 123 (S208 in FIG. 10).

Alternatively, such temperature correction may not be performed in any of the processes mentioned above.

Figure 29:
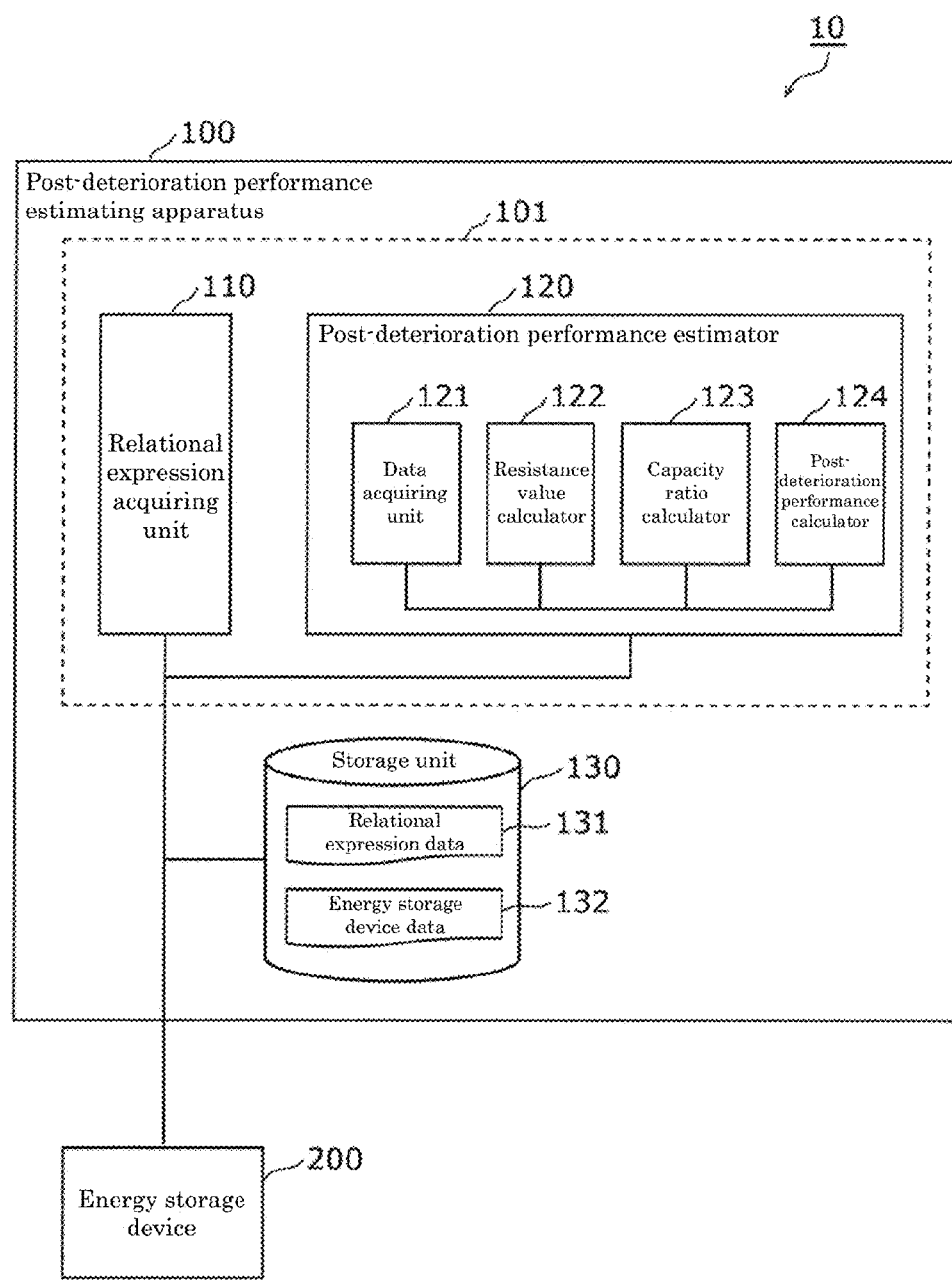
FIG. 29 is a block diagram depicting a configuration embodied by an integrated circuit, of the post-deterioration performance estimating apparatus according to the embodiment of the present invention.

Processors included in the post-deterioration performance estimating apparatus according to the present invention are typically embodied as a large scale integration (LSI) serving as an integrated circuit. As exemplified in FIG. 29, the present invention is embodied as an integrated circuit 101 including the relational expression acquiring unit 110 and the post-deterioration performance estimator 120. FIG. 29 is a block diagram depicting a configuration embodied by the integrated circuit, of the post-deterioration performance estimating apparatus according to the embodiment of the present invention.

The processors included in the integrated circuit 101 can be provided as separate chips, or can be provided as a single chip partially or entirely including the processors. The LSI herein can be called an IC, a system LSI, a super LSI, or an ultra LSI depending on differences in integration degree.

Circuit integration is not limited to the LSI, but can be alternatively embodied by a dedicated circuit or a general purpose processor. Still alternatively, a field programmable gate array (FPGA) or a reconfigurable processor in terms of connection or setting of a circuit cell in the LSI can be applied after fabrication of the LSI.

If development in semiconductor technology or different derivative technology leads to technology for circuit integration to replace the LSI, functional blocks can be obviously integrated in accordance with the technology. For example, biotechnology will be possibly applicable.

The present invention can be embodied as such a post-deterioration performance estimating apparatus, as well as a post-deterioration performance estimating method including the characteristic process steps performed by the post-deterioration performance estimating apparatus.

Moreover, the present invention can be embodied as a program configured to cause a computer to execute the characteristic processes included in the post-deterioration performance estimating method, or can be embodied as a nontemporary recording medium that is readable with a computer storing the program, such as a flexible disk, a hard disk, a CD-ROM, an MO, a DVD, a DVD-ROM, a DVD-RAM, a Blu-ray Disk (BD; registered trademark), or a semiconductor memory. Such a program can be obviously distributed by means of a recording medium such as a CD-ROM or through a transmission medium such as the Internet.

The post-deterioration performance estimating apparatuses and the energy storage systems according to the embodiment and the modification examples of the embodiment of the present invention have been described above. The present invention should not be limited to the embodiment and the modification examples. The embodiment and the modification examples disclosed herein should be regarded as being exemplary and nonlimitative in all aspects. The scope of the present invention is recited not by the above description but by the claims, and is intended to include meanings equivalent to those of the claims and any modification within the scope.

For example, the relational expression acquiring unit 110 according to the above embodiment acquires the relational expression corresponding to the type of the energy storage device 200 of which post-deterioration capacity is to be estimated, with reference to the relational expression data 131 in the storage unit 130. Alternatively, the relational expression acquiring unit 110 can analyze the temporal change of the capacity, the resistance value, the operating temperature, or the like of the energy storage device 200 to calculate and acquire the relational expression. The relational expression acquiring unit 110 can store the capacity, the resistance value, the operating temperature, or the like of the energy storage device 200 for each cumulative operating period, and can calculate a coefficient (constant) by substituting the value in the relational expression to acquire the relational expression.

The relational expression acquiring unit 110 according to any one of the embodiment and the modification examples acquires the relational expression obtained from the value related to the two current values of the first and the second currents. The relational expression acquired by the relational expression acquiring unit 110 is not limitedly obtained from the value related to the two current values. Alternatively, the relational expression acquiring unit 110 can acquire a highly accurate relational expression that is obtained from a value related to three or more current values, or can acquire a relational expression that is obtained from a value related to two appropriate current values selected from values related to the three or more current values.

The post-deterioration performance estimating apparatus 100 according to any one of the embodiment and the modification examples estimates the discharge capacity of the energy storage device 200 at the predetermined deterioration point as the post-deterioration performance value. However, the post-deterioration performance value estimated by the post-deterioration performance estimating apparatus 100 is not limited to the discharge capacity. Alternatively, the post-deterioration performance estimating apparatus 100 can convert the discharge capacity to a performance value such as a residual operating period, the chargeable number of times, a travelable distance, or an internal resistance value, of the energy storage device 200 at the predetermined deterioration point, to estimate the performance value as the post-deterioration performance value.

The scope of the present invention includes any mode obtained by appropriately combining any of the embodiment and the modification examples. For example, the modification example 1 can be modified in accordance with the modification example 2, or the modification example 3 can be modified in accordance with the modification example 1 or 2.

INDUSTRIAL APPLICABILITY

The present invention is applicable to a post-deterioration performance estimating apparatus or the like configured to accurately estimate a post-deterioration performance value indicating performance such as discharge capacity of an energy storage device at a predetermined deterioration point.

DESCRIPTION OF REFERENCE SIGNS 10, 10a, 10b, 10c Energy storage system
100, 100a, 100b, 100c Post-deterioration performance estimating apparatus
101 Integrated circuit
110 Relational expression acquiring unit
120, 120a, 120b, 120c Post-deterioration performance estimator
121 Data acquiring unit
122 Resistance value calculator
123 Capacity ratio calculator
124 Post-deterioration performance calculator
125 Relational expression corrector
126 Equilibrial capacity decreased amount calculator
130, 130a Storage unit
131, 131a Relational expression data
132, 132a Energy storage device data
200 Energy storage device
300 Case

The invention claimed is:

1. A post-deterioration performance estimating apparatus wherein a post-deterioration performance value indicates performance of an energy storage device, the apparatus comprising:
   a post-deterioration performance estimator apparatus configured to electronically apply a first relational expression to electronically estimate the post-deterioration performance value at a deterioration point, the first relational expression includes a first capacity decreased amount and a second capacity decreased amount,
   wherein equilibrial capacity indicates discharge capacity of the energy storage device that is discharged at a second current of a current value smaller than a first current,
   wherein the post-deterioration performance estimator apparatus is configured to electronically obtain the first capacity decreased amount by electronically subtracting the equilibrial capacity at the deterioration point from an initial capacity of the energy storage device, wherein energy storage capacity indicates discharge capacity of the energy storage device that is discharged at the first current, wherein the post-deterioration performance estimator apparatus is configured to electronically obtain the second capacity decreased amount by electricity subtracting the energy storage capacity at the deterioration point from the equilibrial capacity, and wherein replacement of the energy storage device is carried out at a timing based on the post-deterioration performance value.

2. The post-deterioration performance estimating apparatus according to claim 1, wherein the first relational expression includes the initial capacity and a member of an exponential function of a cumulative operating period, the cumulative operating period is a time period from an operation start point of the energy storage device to the deterioration point.

3. The post-deterioration performance estimating apparatus according to claim 1, wherein:
the first relational expression includes a second relational expression and a third relational expression,
second relational expression includes the initial capacity, the first capacity decreased amount, the second capacity decreased amount, and a resistance value of direct current resistance or alternating current resistance of the energy storage device, and
the third relational expression includes the resistance value and a cumulative operating period, the cumulative operating period is a time period from an operation start point of the energy storage device to the deterioration point.

4. The post-deterioration performance estimating apparatus according to claim 3, wherein the resistance value includes a capacity ratio, the capacity ratio is a ratio of the second capacity decreased amount to the equilibrial capacity.

5. The post-deterioration performance estimating apparatus according to claim 4, wherein the capacity ratio is a linear function of the resistance value.

6. The post-deterioration performance estimating apparatus according to claim 4, wherein the post-deterioration performance estimator apparatus includes:
a data acquiring unit configured to acquire the equilibrial capacity at the deterioration point;
a capacity ratio calculator configured to calculate the capacity ratio at the deterioration point in accordance with the resistance value at the deterioration point and the second relational expression; and
a post-deterioration performance calculator configured to calculate the post-deterioration performance value in accordance with a fourth relational expression on relation among the post-deterioration performance value, the acquired equilibrial capacity, and the calculated capacity ratio.

7. The post-deterioration performance estimating apparatus according to claim 6, wherein the post-deterioration performance calculator is configured to calculate the post-deterioration performance value by multiplying a value obtained by subtracting the capacity ratio from one and the equilibrial capacity.

8. The post-deterioration performance estimating apparatus according to claim 3, wherein a coefficient in the second relational expression is variable depending on whether an operating temperature of the energy storage device exceeds a predetermined temperature or is not more than the predetermined temperature.

9. The post-deterioration performance estimating apparatus according to claim 3, wherein the post-deterioration performance estimator apparatus is configured to electronically estimate the post-deterioration performance value in accordance with the third relational expression on the resistance value at a time point after elapse of the cumulative operating period, the resistance value is in proportion to an exponential function that has a variable obtained by multiplying the cumulative operating period and a predetermined coefficient.

10. The post-deterioration performance estimating apparatus according to claim 9, wherein the third relational expression has the predetermined coefficient, the predetermined coefficient is an exponential function having a reciprocal of the operating temperature of the energy storage device as a variable.

11. The post-deterioration performance estimating apparatus according to claim 10, wherein the third relational expression has the coefficient in the exponential function having the reciprocal of the operating temperature of the energy storage device as the variable, the coefficient is variable depending on whether the operating temperature of the energy storage device exceeds or is not more than a predetermined temperature.

12. The post-deterioration performance estimating apparatus according to claim 3, wherein the post-deterioration performance estimator apparatus includes:
a data acquiring unit configured to acquire the cumulative operating period at the deterioration point; and
a resistance value calculator configured to calculate the resistance value at the deterioration point in accordance with the acquired cumulative operating period and the third relational expression.

13. The post-deterioration performance estimating apparatus according to claim 1, wherein:
a cumulative operating period is a time period from an operation start point of the energy storage device to the deterioration point, and
the first relational expression includes a member of a square root of the cumulative operating period and a coefficient in the member of the square root includes an exponential function that has a reciprocal of the operating temperature of the energy storage device as a variable.

14. The post-deterioration performance estimating apparatus according to claim 1, wherein the post-deterioration performance estimator apparatus includes:
a relational expression corrector configured to correct the first relational expression, the relational expression corrector is configured to electronically estimate the post-deterioration performance value in accordance with the corrected first relational expression.

15. The post-deterioration performance estimating apparatus according to claim 1, wherein:
the energy storage device is a lithium-ion secondary battery containing layered lithium transition metal oxide as a positive active material, and
the post-deterioration performance estimator apparatus is configured to electronically estimate the post-deterioration performance value in accordance with the first relational expression for the lithium-ion secondary battery.

16. An energy storage system comprising:
the post-deterioration performance estimating apparatus according to claim 1; and
the energy storage device.

17. A post-deterioration performance method wherein:
a post-deterioration performance value indicates performance of an energy storage device,
equilibrial capacity of the energy storage device indicates discharge capacity of the energy storage device that is discharged at a second current of a current value smaller than a first current, and
energy storage capacity indicates discharge capacity of the energy storage device that is discharged at the first current,
the method comprising:
electronically subtracting, by a post-deterioration performance estimator apparatus, the equilibrial capacity at a deterioration point from an initial capacity of the energy storage device to obtain a first capacity decreased amount;
electronically subtracting, by the post-deterioration performance estimator apparatus, the energy storage capacity at the deterioration point from the equilibrial capacity to obtain a second capacity decreased amount; and
electronically applying, by the post-deterioration performance estimator apparatus, a first relational expression to electronically estimate the post-deterioration performance value at the deterioration point,
wherein the first relational expression includes the first capacity decreased amount and the second capacity decreased amount,
and wherein replacement of the energy storage device is carried out at a timing based on the post-deterioration performance value.

18. An integrated circuit wherein a post-deterioration performance value indicates performance of an energy storage device, the integrated circuit comprising:
a post-deterioration performance estimator apparatus configured to electronically apply a first relational expression to electronically estimate the post-deterioration performance value at a deterioration point, the first relational expression includes a first capacity decreased amount and a second capacity decreased amount,
wherein equilibrial capacity indicates discharge capacity of the energy storage device that is discharged at a current of a second current value smaller than a first current,
wherein the post-deterioration performance estimator apparatus is configured to electronically obtain the first capacity decreased amount by electronically subtracting the equilibrial capacity at the deterioration point from an initial capacity of the energy storage device,
wherein energy storage capacity indicates discharge capacity of the energy storage device that is discharged at the first current,
wherein the post-deterioration performance estimator apparatus is configured to electronically obtain the second capacity decreased amount by electronically subtracting the energy storage capacity at the deterioration point from the equilibrial capacity,
and wherein replacement of the energy storage device is carried out at a timing based on the post-deterioration performance value.

\* \* \* \* \*